United States Patent
Chang et al.

(10) Patent No.: US 10,135,469 B2
(45) Date of Patent: Nov. 20, 2018

(54) UPLINK AND DOWNLINK CARRIER AGGREGATION

(71) Applicant: SKYWORKS SOLUTIONS, INC., Woburn, MA (US)

(72) Inventors: Shiaw Wen Chang, Thousand Oaks, CA (US); Brian Blu Duverneay, Wyoming, MI (US); Sarah Shiui Xu, Thousand Oaks, CA (US); David Richard Pehlke, Westlake Village, CA (US)

(73) Assignee: SKYWORKS SOLUTIONS, INC., Woburn, MA (US)

( * ) Notice: Subject to any disclaimer, the term of this patent is extended or adjusted under 35 U.S.C. 154(b) by 0 days.

(21) Appl. No.: 15/484,045

(22) Filed: Apr. 10, 2017

(65) Prior Publication Data
US 2017/0222665 A1     Aug. 3, 2017

Related U.S. Application Data

(63) Continuation of application No. 14/487,004, filed on Sep. 15, 2014, now Pat. No. 9,621,327.
(Continued)

(51) Int. Cl.
*H04B 1/44* (2006.01)
*H04B 1/00* (2006.01)
(Continued)

(52) U.S. Cl.
CPC .............. *H04B 1/006* (2013.01); *H04B 1/48* (2013.01); *H04L 5/0041* (2013.01); *H04L 5/1469* (2013.01); *H04B 2001/0408* (2013.01)

(58) Field of Classification Search
CPC ... H04B 1/006; H04B 1/48; H04B 2001/0408
(Continued)

(56) References Cited

U.S. PATENT DOCUMENTS 9,100,060 B2 * 8/2015 Ilkov .................... H03H 7/465
9,621,327 B2    4/2017 Chang et al.
(Continued)

FOREIGN PATENT DOCUMENTS

WO    WO 2003/026158    3/2003
WO    WO 2012/156946    11/2012
WO    WO 2013/041146    3/2013

OTHER PUBLICATIONS

International Search Report and Written Opinion dated Jan. 13, 2015 in connection with corresponding PCT Application No. PCT/US2014/055721.
(Continued)

*Primary Examiner* — April G Gonzales
(74) *Attorney, Agent, or Firm* — Chang & Hale LLP

(57) ABSTRACT

Improved switched multiplexer architecture for supporting carrier aggregation in front-end applications. In some embodiments, an N-plexing system can include an assembly of filters configured to provide N filtered paths, and a switching circuit in communication with the assembly of filters. The switching circuit can be configured to provide a plurality of switchable paths between the assembly of filters and an antenna port to allow simultaneous operation between the N filtered paths and the antenna port. In some embodiments, N can be 4 for a quadruplexing system or 2 for a duplexing system, and such a system can be implemented in a front-end module (FEM) for wireless devices.

20 Claims, 11 Drawing Sheets

Related U.S. Application Data

(60) Provisional application No. 61/879,128, filed on Sep. 17, 2013, provisional application No. 61/929,961, filed on Jan. 21, 2014.

(51) Int. Cl.
*H04B 1/48* (2006.01)
*H04L 5/14* (2006.01)
*H04L 5/00* (2006.01)
*H04B 1/04* (2006.01)

(58) Field of Classification Search
USPC .......................................................... 455/78
See application file for complete search history.

(56) References Cited

U.S. PATENT DOCUMENTS

| | | | | |
|---|---|---|---|---|
| 2011/0234332 A1* | 9/2011 | Takahashi | ................ | H01P 1/36 333/1.1 |
| 2011/0260806 A1* | 10/2011 | Takeuchi | ................ | H03H 7/38 333/103 |
| 2012/0146742 A1* | 6/2012 | Caron | .................... | H04B 1/109 333/132 |
| 2012/0224514 A1* | 9/2012 | Shibata | ................ | H04B 1/0057 370/277 |
| 2012/0302188 A1* | 11/2012 | Sahota | .................. | H04B 1/006 455/150.1 |
| 2013/0069197 A1* | 3/2013 | Kim | ........................ | H01L 21/56 257/531 |
| 2014/0112213 A1* | 4/2014 | Norholm | .................. | H04B 1/56 370/277 |

OTHER PUBLICATIONS

Qualcomm Incorporated, Diplexing and Quadplexing Between Band 5 and Band 12, 3GPP TSG-RAN WG4 #63, May 21-25, 2012.

U.S. Appl. No. 15/484,043 entitled "Front-End Modules With Switched Filter Assembles for Carrier Aggregation," filed Apr. 10, 2017.

\* cited by examiner

UPLINK AND DOWNLINK CARRIER AGGREGATION

CROSS-REFERENCE TO RELATED APPLICATIONS

This application is a continuation of U.S. application Ser. No. 14/487,004 filed Sep. 15, 2014, entitled "SYSTEMS AND METHODS RELATED TO CARRIER AGGREGATION FRONT-END MODULE APPLICATIONS," which claims priority to U.S. Provisional Application No. 61/879,128 filed Sep. 17, 2013, entitled "IMPROVED SWITCHED MULTIPLEXER ARCHITECTURE TO SUPPORT CARRIER AGGREGATION FRONT END MODULE APPLICATIONS," and U.S. Provisional Application No. 61/929,961 filed Jan. 21, 2013, entitled "SYSTEMS AND METHODS RELATED TO CARRIER AGGREGATION FRONT-END MODULE APPLICATIONS," the disclosure of each of which is hereby expressly incorporated by reference herein in its respective entirety for all purposes.

BACKGROUND

Field

The present disclosure relates to systems and methods for carrier aggregation in front-end module applications.

Description of the Related Art

Many designs for wireless devices such as smartphones and tablets desire lower cost and smaller size, while simultaneously increasing complexity and performance requirements. Radio-frequency (RF) front-end modules (FEMs) provide a platform where at least some of such designs can be implemented. For example, functionalities associated with switching, filtering, and power amplifiers (PAs) can be implemented in a FEM.

SUMMARY

In accordance with some implementations, the present disclosure relates to an N-plexing system that includes an assembly of filters configured to provide N filtered paths, and a switching circuit in communication with the assembly of filters. The switching circuit is configured to provide a plurality of switchable paths between the assembly of filters and an antenna port to allow simultaneous operation between the N filtered paths and the antenna port.

In some embodiments, N can be equal to 4 such that the N-plexing system is a quadruplexing system. In some embodiments, the assembly of filters can include a first duplexer and a second duplexer, with each duplexer being configured to provide two filtered paths. In some embodiments, the assembly of filters can include a duplexer and two individual filters, with the duplexer being configured to provide two filtered paths, and each individual filter being configured to provide one filtered path. In some embodiments, the assembly of filters can include four individual filters, with each individual filter being configured to provide one filtered path.

In some embodiments, N can be equal to 2 such that the N-plexing system is a duplexing system. The assembly of filters can include two individual filters, with each individual filter being configured to provide one filtered path.

In some embodiments, the N-plexing system can further include a plurality of signal conditioning circuits implemented between the assembly of filters and the switching circuit. In some embodiments, at least some of the signal conditioning circuits can include an impedance matching circuit. In some embodiments, at least some of the signal conditioning circuits can include a filter configured to reject a harmonic component. Such a filter can be configured as a notch filter, and the harmonic component can include a second harmonic.

In some embodiments, at least some of the signal conditioning circuits can include a phase shifting circuit. Such a phase shifting circuit can be configured to include tunable shifting of phase.

In a number of implementations, the present disclosure relates to a method for operating a wireless device. The method includes enabling simultaneous operation of N filtered signals. The method further includes performing one or more switching operations to provide a plurality of switched paths for the N filtered signals to and from an antenna.

In some implementations, the present disclosure relates to a switch module that includes a packaging substrate configured to receive a plurality of components, and a switching circuit implemented on the packaging substrate. The switching circuit includes a plurality of switchable paths between an antenna port and respective filter nodes. The plurality of switchable paths are configured to be operated together to allow simultaneous operation between the antenna port and N filtered paths coupled to the filter nodes.

In a number of teachings, the present disclosure relates to a front-end module (FEM) that includes a filter circuit configured to provide N filtered paths, with each filtered path including a node capable of being coupled to a receiver circuit or a transmitter circuit. The FEM further includes a switching circuit in communication with the filter. The switching circuit is configured to provide a plurality of switchable paths between the filter circuit and an antenna port to allow simultaneous operation between the N filtered paths and the antenna port.

In some embodiments, the switching circuit can be implemented on an antenna switching module (ASM). In some embodiments, the switching circuit can be implemented on a semiconductor die. In some embodiments, at least some of the filter circuit can be implemented on the semiconductor die.

According to some implementations, the present disclosure relates to a radio-frequency (RF) device that includes a transceiver configured to process RF signals, and a front-end module (FEM) in communication with the transceiver. The FEM includes a filter circuit configured to provide N filtered paths, with each filtered path including a node capable of being coupled to a receiver circuit or a transmitter circuit. The FEM further includes a switching circuit in communication with the filter. The switching circuit is configured to provide a plurality of switchable paths between the filter circuit and an antenna port to allow simultaneous operation between the N filtered paths and the antenna port. The RF device further includes an antenna in communication with the antenna port. In some embodiments, the RF device can include a wireless device such as a cellular phone.

In some implementations, the present disclosure relates to a switching circuit having a first switch between a B1 duplexer and an antenna port, and a second switch between a B7 duplexer and the antenna port.

In some implementations, the present disclosure relates to a switching circuit having a first switch between a B2 duplexer and an antenna port, and a second switch between a B4 duplexer and the antenna port.

In some implementations, the present disclosure relates to a switching circuit having a first switch between a B5 duplexer and an antenna port, and a second switch between a B12 duplexer and the antenna port.

In some implementations, the present disclosure relates to a switching circuit having a first switch between a B8 duplexer and an antenna port, and a second switch between a B17 or B20 duplexer and the antenna port.

In some implementations, the present disclosure relates to a radio-frequency (RF) circuit that includes an assembly of filters configured to provide duplexer capability for each of a plurality of bands. The assembly of filters includes an aggregated filter configured to filter a first RF signal associated with a first band and a second RF signal associated with a second band different than the first band. The RF circuit further includes a switching circuit in communication with the assembly of filters and an antenna port. The switching circuit includes a switchable path in communication with the aggregated filter and the antenna port. The switchable path is configured to facilitate passage of the first RF signal and the second RF signal through the aggregated filter.

In some embodiments, the switching circuit can further include a band selection switch in communication with the switchable path and the antenna port, with the switching circuit being configured to select a duplex signal path for each of the plurality of bands. In some embodiments, the RF circuit can further include an assembly of phase delay components, with the assembly of phase delay components being configured to facilitate aggregation of RF signal paths resulting from operation of the aggregated filter.

In some embodiments, the switchable circuit can include a field-effect transistor (FET) switch. The FET switch can include a silicon-on-insulator (SOI) FET.

In some embodiments, at least some portions of the first band and the second band can overlap. The plurality of bands can include, for example, B1, B3 and B4, with B1 having a transmit (TX) frequency range of 1920 to 1980 MHz and a receive (RX) frequency range of 2110 to 2170 MHz, B3 having a TX frequency range of 1710 to 1785 MHz and an RX frequency range of 1805 to 1880 MHz, and B4 having a TX frequency range of 1710 to 1755 MHz and an RX frequency range of 2110 to 2155 MHz. The aggregated filter can be configured to aggregate B1 RX and B4 RX bands. The aggregated filter can be configured to aggregate B3 TX and B4 TX bands. In some embodiments, the plurality of bands can further include B2 having a TX frequency range of 1850 to 1910 MHz and an RX frequency range of 1930 to 1990 MHz.

According to a number of implementations, the present disclosure relates to a radio-frequency (RF) module that includes a packaging substrate configured to receive a plurality of components, and an assembly of filters implemented on the packaging substrate. The assembly of filters is configured to provide duplexer capability for each of a plurality of bands. The assembly of filters includes an aggregated filter configured to filter a first RF signal associated with a first band and a second RF signal associated with a second band different than the first band. The RF module further includes an antenna switching module (ASM) implemented on the packaging module. The ASM is in communication with the assembly of filters and an antenna port. The ASM includes a switchable path in communication with the aggregated filter and the antenna port. The switchable path is configured to facilitate passage of the first RF signal and the second RF signal through the aggregated filter.

In some embodiments, the RF module can be a front-end module (FEM). The FEM can further include a power amplifier module (PAM) having a plurality of power amplifiers.

According to some implementations, the present disclosure relates to a radio-frequency (RF) device that includes a transceiver configured to process RF signals, and a front-end module (FEM) in communication with the transceiver. The FEM includes an assembly of filters configured to provide duplexer capability for each of a plurality of bands. The assembly of filters includes an aggregated filter configured to filter a first RF signal associated with a first band and a second RF signal associated with a second band different than the first band. The FEM further includes an antenna switching module (ASM) in communication with the assembly of filters and an antenna port. The ASM includes a switchable path in communication with the aggregated filter and the antenna port. The switchable path is configured to facilitate passage of the first RF signal and the second RF signal through the aggregated filter. The RF device further includes an antenna in communication with the antenna port. The antenna is configured to facilitate either or both of transmission and receiving of RF signals. In some embodiments, RF device can include a wireless device such as a cellular phone.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

DETAILED DESCRIPTION OF SOME EMBODIMENTS

The headings provided herein, if any, are for convenience only and do not necessarily affect the scope or meaning of the claimed invention.

Figure 1:
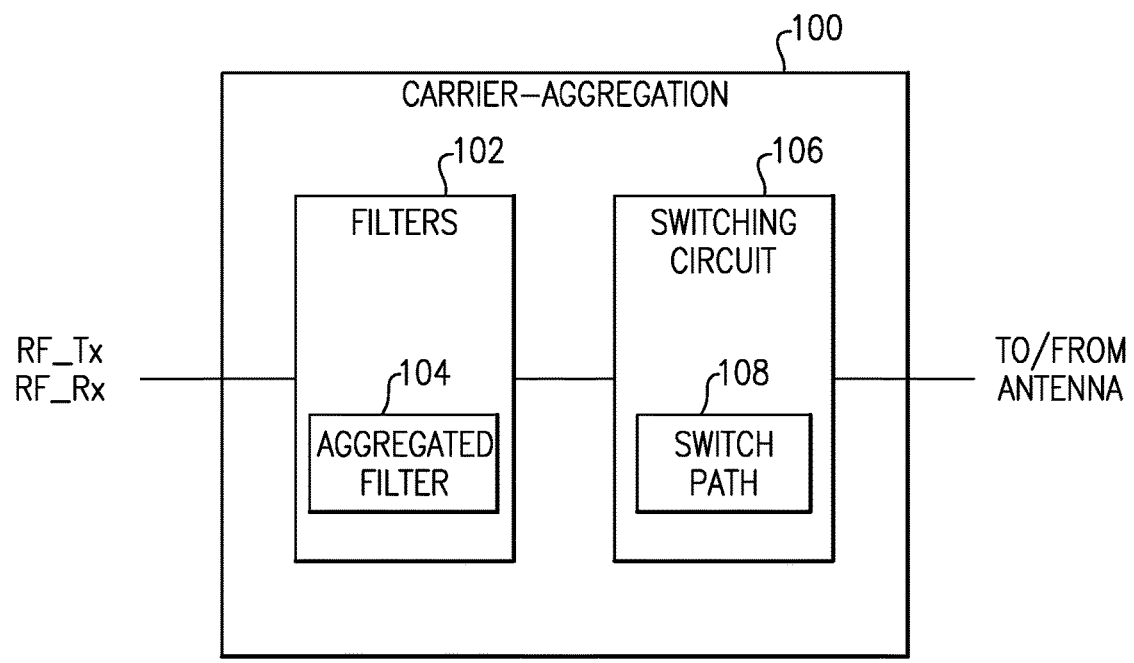
FIG. 1 schematically depicts a carrier-aggregation architecture having one or more features as described herein.

FIG. 1 schematically depicts a carrier-aggregation architecture 100 having one or more features as described herein. In some embodiments, such an architecture can include an assembly of filters 102 and a switching circuit 106 configured to provide duplexing or multiplexing functionalities for radio-frequency (RF) signals to be transmitted (RF_TX) and received RF signals (RF_RX). Such RF signals can be transmitted and received through one or more antennas. Such duplexing/multiplexing functionalities can be provided for different bands associated with wireless devices.

FIG. 1 further shows that in some embodiments, at least one filter in the assembly of filters 102 can be an aggregated filter 104 configured to provide filtering functionality for two or more different bands. As described herein, such an aggregated filter can advantageously reduce the number of filters and RF ports. FIG. 1 further shows that the switching circuit 106 can include a switch path 108 that is configured to accommodate the aggregated filtering functionality associated with the aggregated filter 104. Various examples of such aggregated filters and switched paths are described herein in greater detail.

Many designs for wireless devices such as smartphones and tablets desire lower cost and smaller size, while simultaneously increasing complexity and performance requirements. Radio-frequency (RF) front-end modules (FEMs) provide a platform where at least some of such designs can be implemented. For example, functionalities associated with switching, filtering, and power amplifiers (PAs) can be implemented in a FEM, and such a design can be desirable due to an increase in the number of networks, regions and technologies supported in modern devices.

As an example, it is noted that one of the challenges is to design a quadruplexer with acceptable insertion loss for system requirements, including new carrier aggregation technology that supports, for example, transmit in one TX band and receive in two RX bands simultaneously. As a more specific example, such carrier aggregation can include following example configurations. In an example configuration, Band 1 (B1) and Band 3 (B3) can be aggregated as follows: Transmit B1 and receive B1 and B3, or transmit B3 and receive B1 and B3. In another example configuration, Band 2 (B2) and Band 4 (B4) can be aggregated as follows: Transmit B2 and receive B2 and B4, or transmit B4 and receive B2 and B4.

In some situations, carrier aggregation can result in additional loss in a quadruplexer. Accordingly, a FEM may require PAs to deliver more RF power, thereby increasing current consumption from the battery and increasing thermal dissipation in related semiconductor devices.

Some conventional quadruplexer designs include a combination of two duplexers (e.g., two TX and two RX filters) to a switch, and the switch can be connected to an antenna. Such a design typically will increase insertion loss in the RF signal path significantly due to the loading effect of unused filters.

In the context of an FEM having most or all of the RF content between a transceiver and an antenna, such an FEM can include an antenna switch module (ASM), filters for transmit and receive bands, and power amplifiers (PAs). With such a FEM covering a significant number of bands in a single package, the result can be a vast network of filters, duplexers, and power amplifiers.

In current FEM designs, the ASM is typically used to switch and select the band in use and electrically connect it to the antenna. For frequency-division duplexing (FDD) 3G and 4G networks, the selected path on the ASM is typically used for both transmit and receive functions. A duplexer for each band can provide the filtering necessary or desired for transmit and receive paths. Thus, a duplexer is typically required for each of the many bands implemented in such an FEM design.

Disclosed herein are examples of architectures, circuits and methods related to a FEM having carrier aggregation which can be implemented while maintaining performance in one or more areas within acceptable range(s). Such examples of carrier aggregation are described in the context of Bands 1, 2, 3 and 4 (B1, B2, B3 and B4); however, it will be understood that one or more features of the present disclosure can also be implemented in other combinations of bands. It will also be understood that one or more features of the present disclosure can also be implemented in architectures where various components are not necessarily within a single module.

In some implementations, a switched multiplexer architecture can be configured to utilize one or more overlapping frequency ranges among different bands. For example, in the context of B1, B2, B3 and B4, frequency ranges associated with these example bands are listed in Table 1.

TABLE 1

| Band | TX Frequency (MHz) | RX Frequency (MHz) |
|------|--------------------|--------------------|
| B1   | 1920 to 1980       | 2110 to 2170       |
| B2   | 1850 to 1910       | 1930 to 1990       |
| B3   | 1710 to 1785       | 1805 to 1880       |
| B4   | 1710 to 1755       | 2110 to 2155       |

One can see that B4 receive frequency band lies within the B1 receive frequency band, and B4 transmit frequency band lies within the B3 transmit frequency band.

Figure 3:
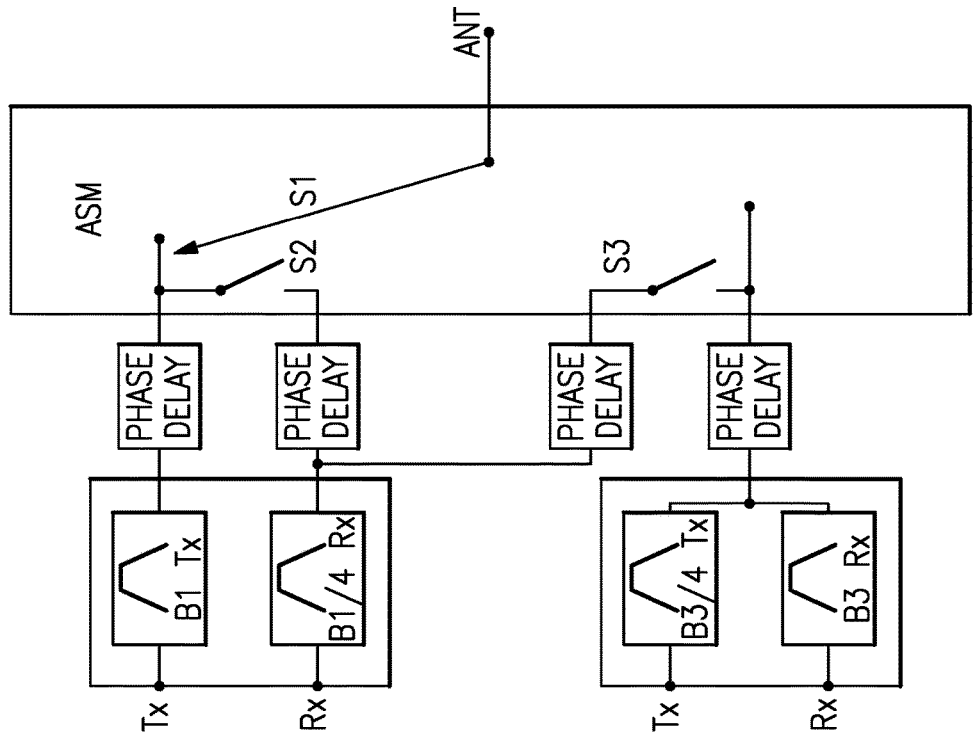
FIG. 3 shows an example where some or all of circuits and related components associated with a B4 duplexer can be removed.
Figure 2:
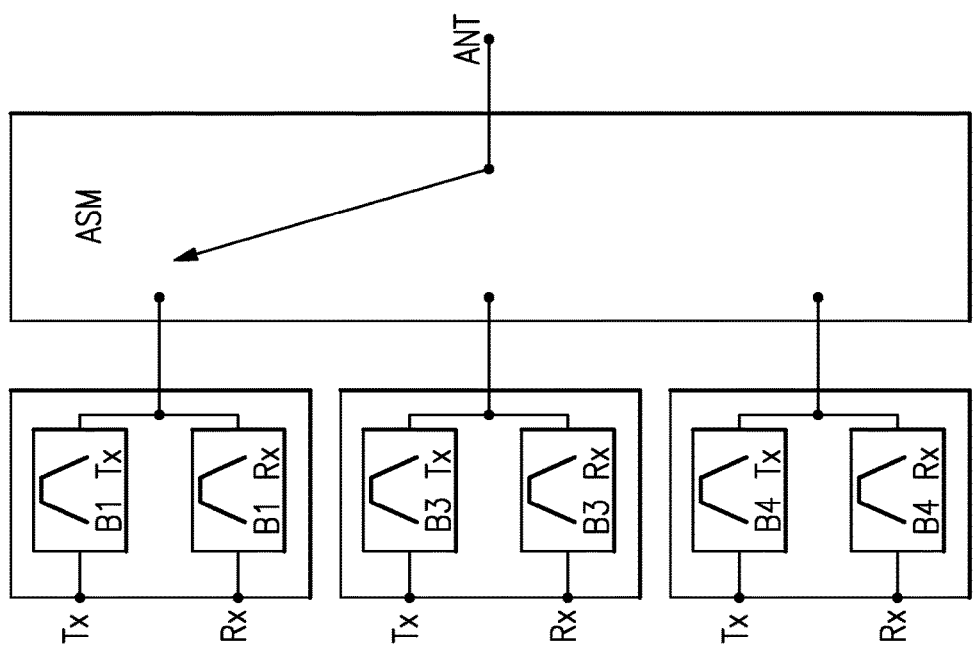
FIG. 2 show an example of a front-end module (FEM) architecture that utilizes a conventional implementation of B1, B3 and B4 bands.

FIG. 2 show an example of a FEM architecture that utilizes a conventional implementation of B1, B3 and B4 bands. Although not shown, it will be understood that other bands can also be implemented in such an architecture. One can see that each band includes a separate duplexer, and each duplexer includes TX and RX filters. Thus, there are at least six filters for the three example bands B1, B3 and B4. The three example duplexers corresponding to the foregoing three bands are shown to be in communication with an antenna port through an antenna switching module (ASM). Example: Switched Multiplexer Design for B1, B3 and B4:

FIG. 3 shows that in some embodiments, some or all of circuits and related components associated with the B4 duplexer can be removed, thereby reducing size and cost of the FEM considerably. In the context of the example of FIG. 2, the entire duplexer for B4 can be removed, thereby reducing the number of filters by at least two.

In the example shown in FIG. 3, a first duplexer is shown to include a B1 TX filter and a B1/4 RX filter that can provide RX filtering functionality for B1 and B4. The B1 TX filter can be connected (e.g., through a phase delay component) to a first switching node (e.g., a first throw) of an antenna switch S1 of an ASM. The B1/4 RX filter can be connected (e.g., through a phase delay component and a switch S2) to the first switching node of the antenna switch S1.

In the example shown in FIG. 3, a second duplexer is shown to include a B3 RX filter and a B3/4 TX filter that can provide TX filtering functionality for B3 and B4. The B3 RX filter can be connected (e.g., through a phase delay component) to a second switching node (e.g., a second throw) of the antenna switch S1. The B3/4 TX filter can be connected (e.g., through the same phase delay component for B3 RX) to the second switching node of the antenna switch S1.

In the example shown in FIG. 3, the B1/4 RX filter can be connected (e.g., through a phase delay component and a switch S3) to the second switching node of the antenna switch S1. Accordingly, TX and RX operations of B1, B3 and B4 can be effectuated by example switch states listed in Table 2.

TABLE 2

| State | TX | RX | S1 | S2 | S3 |
|---|---|---|---|---|---|
| 1 | B1 | B1 | First throw | 1 | 0 |
| 2 | B3 | B3 | Second throw | 0 | 0 |
| 3 | B4 | B1/B3/B4 | Second throw | 0 | 1 |
| 4 | B1 | B1/B3 | First throw | 1 | 1 |

In some embodiments, an ASM can include switches such as FET (field-effect transistor) SOI (silicon-on-insulator) switches implemented at selected paths to facilitate the example carrier aggregation configuration of FIG. 3. Although described in the context of FET SOI switches, it will be understood that one or more features of the present disclosure can also be implemented utilizing other types of switches. In some embodiments, phase delay components such as phase delay networks can be implemented as shown and described herein to facilitate the corresponding example multiplexer topologies.

In some implementations, band filters (in a carrier-aggregated configuration) that do not need to pass through an FET SOI can have similar or substantially identical filtering performance as their counterparts in a non-carrier-aggregated configuration. In the example of FIG. 3, the performance of the transmit band filters (e.g., B1 TX, B3/4 TX) can be similar or substantially identical to the performance associated with the example of FIG. 2. B3 receive (B3 RX) can also have similar or substantially identical filtering performance as B3 RX of the example of FIG. 2.

In the example shown in FIG. 3, in addition to the reduced number of band filters, the number of receive and/or transmit ports (e.g., receive outputs) on the FEM can be reduced, allowing for a smaller FEM footprint and easier, potentially higher performance transceiver implementation. Additionally, the ASM in FIG. 3 has one fewer throw than the example configuration of FIG. 2, thereby allowing the ASM to be implemented in a smaller and a more cost-effective manner for the FEM.

In the example shown in FIG. 3, the receive bands for B1 and B4 can incur additional loss (e.g., 0.4 dB) in implementations where SOI switches (S2 and/or S3) are utilized. Such an additional loss may be acceptable in some applications. In some embodiments, such SOI switches can be configured to provide reduced loss, thereby reducing the foregoing example loss for B1/4 RX.

As described herein, the example configuration of FIG. 3 can have at least two less band filters than the example of FIG. 2. Such reduction in the number of filters can provide an advantageous feature where loading loss resulting from unused filters is reduced.

Figure 4:
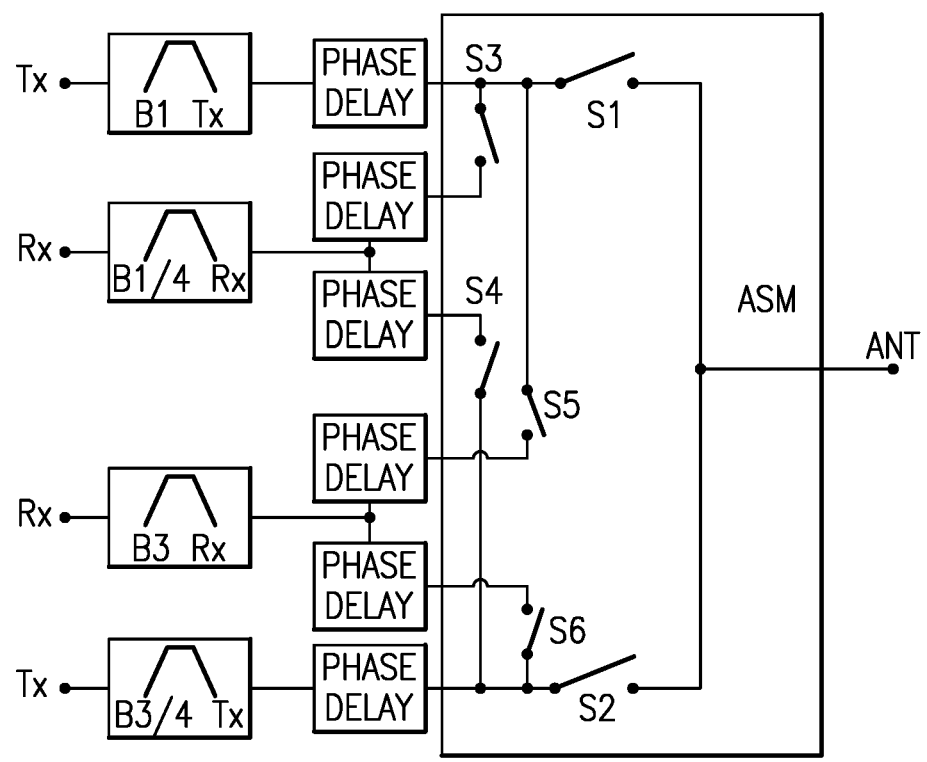
FIG. 4 shows an example where a carrier aggregation configuration can be implemented to address 4G systems.

Example: Switched Multiplexer Design for B1 or B3 TX+B1 and B3 RX:

FIG. 4 shows that in some embodiments, a carrier aggregation configuration can be implemented to address 4G systems, including, for example, LTEAdvanced, which is being standardized in 3GPP as part of LTE Release 10. The example configuration of FIG. 4 can allow, among others, scalable expansion of effective bandwidth delivered to a user terminal through concurrent utilization of radio resources across multiple carriers. Such carriers utilize different bandwidths, and may be in the same or different bands to provide maximum or improved flexibility in utilizing a limited radio spectrum available to operators.

In the example shown in FIG. 4, a B1 TX filter can be connected to an antenna port of an ASM through a phase delay component and a switch S1. A B1/4 RX filter can be connected to the antenna port of the ASM through a phase delay component, a switch S3, and the switch S1. The B1/4 RX filter can also be connected to the antenna port through a phase delay component, a switch S4, and a switch S2. A B3 RX filter can be connected to the antenna port of the ASM through a phase delay component, a switch S5, and the switch S1. The B3 RX filter can also be connected to the antenna port through a phase delay component, a switch S6, and the switch S2. A B3/4 TX filter can be connected to the antenna port of the ASM through a delay component and the switch S2. Accordingly, TX and RX operations of B1, B3 and B4 can be effectuated by example switch states listed in Table 3.

TABLE 3

| State | TX | RX | S1 | S2 | S3 | S4 | S5 | S6 |
|---|---|---|---|---|---|---|---|---|
| 1 | B1 | B1 | 1 | 0 | 1 | 0 | 0 | 0 |
| 2 | B3 | B3 | 0 | 1 | 0 | 0 | 0 | 1 |
| 3 | B4 | B4 | 0 | 1 | 0 | 1 | 0 | 0 |
| 4 | B1 | B1 & B3 | 1 | 0 | 1 | 0 | 1 | 0 |
| 5 | B3 | B1 & B3 | 0 | 1 | 0 | 1 | 0 | 1 |

In the example of FIG. 4, the performance of the transmit band filters B1 TX and B3/4 TX can be similar or substantially identical to the performance associated with a non-carrier-aggregated counterpart (e.g., FIG. 2). The receive bands for B1, B3 and B4 can incur additional loss (e.g., 0.5 dB) in implementations where SOI switches (e.g., S3-S6) are utilized. However, such a loss can be relatively small when compared to loss (e.g., 1.0 dB) resulting from an extra duplexer associated with a non-carrier-aggregated configuration such as the example of FIG. 2. In some embodiments, such SOI switches can be configured to provide reduced loss, thereby reducing the foregoing example loss for the receive bands for B1, B3 and B4.

In the example shown in FIG. 4, in addition to the reduced number of band filters, the number of receive and/or transmit ports (e.g., receive outputs) on the FEM can be reduced, allowing for a smaller FEM footprint and easier, potentially higher performance transceiver implementation. Further, the example carrier-aggregation configuration of FIG. 4 can also be modified to support a more complex multi-band carrier aggregation designs.

Figure 5:
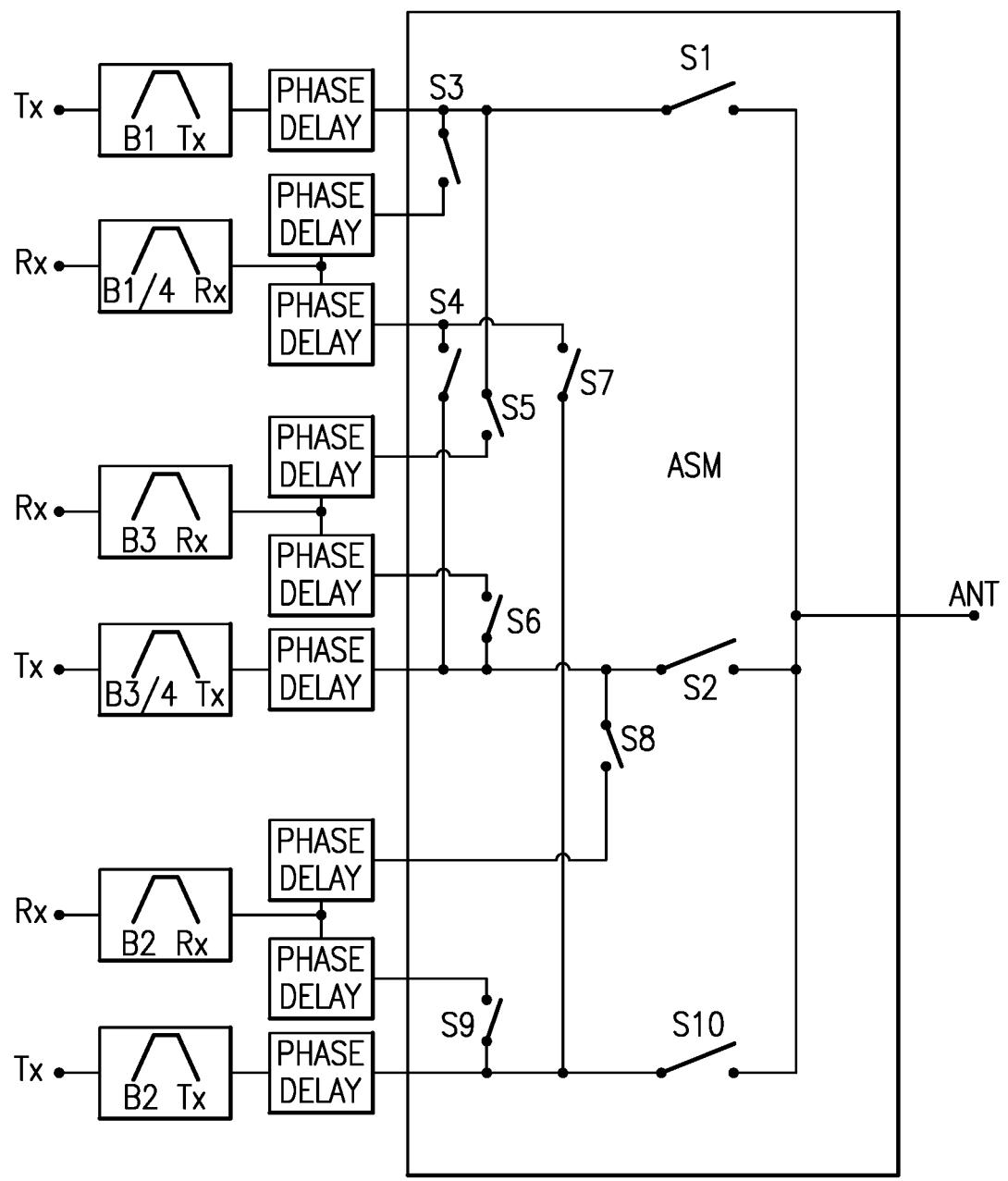
FIG. 5 shows an example where a carrier aggregation configuration such as the example of FIG. 4 can be modified to accommodate more complex designs.

Example: Switched Multiplexer Design for B1/3TX+ B1&3RX & B2/4TX+B2&4RX:

FIG. 5 shows that in some embodiments, a carrier aggregation configuration such as the example of FIG. 4 can be modified to accommodate more complex designs. In the example shown in FIG. 5, B2 band capability is added, and aggregation of at least some portion of such an additional band can be implemented.

In the example shown in FIG. 5, B1 TX, B1/4 RX, B3 RX and B3/4 TX filters can be connected to an antenna port of an ASM through phase delay components and switches S1-S6 in similar manners as described in reference to FIG. 4. Additionally, the B1/4 RX filter can be connected to the antenna port of the ASM through its corresponding phase delay component, a switch S7, and a switch S10. A B2 TX filter can be connected to the antenna port through a phase delay component and the switch S10. A B2 RX filter can be connected to the antenna port through a phase delay component, a switch S8, and the switch S2. The B2 RX filter can also be connected to the antenna port through a phase delay component, a switch S9, and the switch S10. Accordingly, TX and RX operations of B1, B2, B3 and B4 can be effectuated by example switch states listed in Table 4.

TABLE 4

| State | TX | RX | S1 | S2 | S3 | S4 | S5 | S6 | S7 | S8 | S9 | S10 |
|---|---|---|---|---|---|---|---|---|---|---|---|---|
| 1 | B1 | B1 | 1 | 0 | 1 | 0 | 0 | 0 | 0 | 0 | 0 | 0 |
| 2 | B2 | B2 | 0 | 0 | 0 | 0 | 0 | 0 | 0 | 0 | 1 | 1 |
| 3 | B3 | B3 | 0 | 1 | 0 | 0 | 0 | 1 | 0 | 0 | 0 | 0 |
| 4 | B4 | B4 | 0 | 1 | 0 | 1 | 0 | 0 | 0 | 0 | 0 | 0 |
| 5 | B1 | B1&3 | 1 | 0 | 1 | 0 | 1 | 0 | 0 | 0 | 0 | 0 |
| 6 | B3 | B1&3 | 0 | 1 | 0 | 1 | 0 | 1 | 0 | 0 | 0 | 0 |
| 7 | B2 | B2&4 | 0 | 0 | 0 | 0 | 0 | 0 | 1 | 0 | 1 | 1 |
| 8 | B4 | B2&4 | 0 | 1 | 0 | 1 | 0 | 0 | 0 | 1 | 0 | 0 |

In the example of FIG. 5, the performance of the transmit band filters B1 TX, B3/4 TX and B2 TX can be similar or substantially identical to the performance associated with a non-carrier-aggregated counterpart. The receive bands for B1, B2, B3 and B4 can incur additional loss in implementations where SOI switches (e.g., S3-S9) are utilized. However, such a loss can be relatively small when compared to loss resulting from an extra duplexer(s) associated with a non-carrier-aggregated configuration. In some embodiments, such SOI switches can be configured to provide reduced loss, thereby reducing the foregoing example loss for the receive bands for B1, B2, B3 and B4.

In the example shown in FIG. 5, in addition to the reduced number of band filters, the number of receive and/or transmit ports (e.g., receive outputs) on the FEM can be reduced, allowing for a smaller FEM footprint and easier, potentially higher performance transceiver implementation.

Additional Examples of Switched Multiplexer Designs:

FIGS. 6-11 show additional examples related to switched multiplexer designs. In many smart mobile device designs, lower cost and smaller size are desirable features in front-end modules (FEMs), while simultaneously increasing complexity and requirements in device designs. Currently, many smart mobile devices support, for example, 2G:GSM Quadband, 3G/4G FDD:B1, 2, (3 or 4), 5, 7, 8, 13, (17 or 20) without LTE carrier aggregation; and TDD:B38, B39, B40 without LTE carrier aggregation. Next generation and/or other future designs in many smart mobile devices can support, for example, 2G:GSM quadband, 3G/4G FDD:B1, 2, 3, 4, 5, 7, 8, 12, 13, (17 or 20) with LTE carrier aggregation. Such carrier aggregation can include, for example, (1) two carrier aggregation with one HB Rx(B1, 2, 3, 4, 7) and one LB Rx (B5, 8, 17, 20); (2) three carrier aggregation with two HB Rx(B1+7, B2+4, B3+7) and one LB Rx; and/or (3) three carrier aggregation with two LB Rx(B5+12, B5+17, B8+20) and one HB Rx. The foregoing next generation and/or other future designs can also support, for example, TDD:B30, B38, B39, B40, B41, with LTE carrier aggregation for B40(B40A, B40B), B41(B41A, B41B, B41C).

Figure 6:
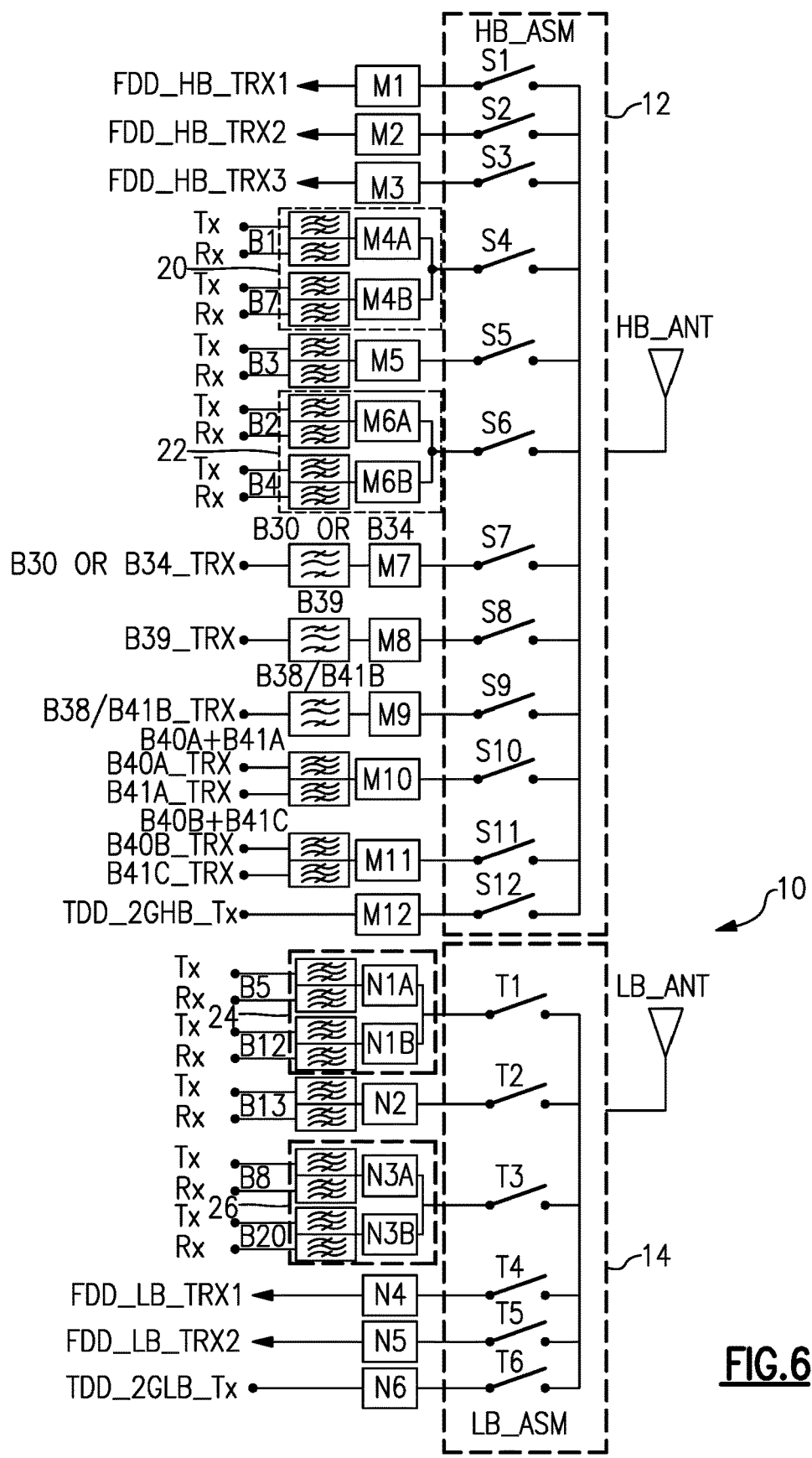
FIG. 6 shows an example of a FEM that utilizes a traditional duplexer and quadruplexer design to support LTE carrier aggregation.

FIG. 6 shows an example of a front-end module (FEM) 10 that utilizes a traditional duplexer and quadruplexer design to support LTE carrier aggregation. The example FEM 10 is shown to include an antenna switch system having a high-band antenna switch module (ASM) (HB_ASM) 12 and a low-band ASM (LB_ASM) 14. The high-band ASM (HB_ASM) 12 is shown to provide switching functionality between a high-band antenna (HB_ANT) and a number of frequency bands. The low-band ASM (LB_ASM) 14 is shown to provide switching functionality between a low-band antenna (LB_ANT) and a number of frequency bands. In FIG. 6, each of circuits depicted as blocks M1, M2, M3, M4A, M4B, M5, M6A, M6B, M7, M8, M9, M10, M11, M12, N1A, N1B, N2, N3A, N3B, N4, N5 and N6 can be configured to provide impedance matching and/or phase shifting functionality (e.g., utilizing L and/or C elements).

In the example of FIG. 6, switch S1 is shown to provide a switchable path between HB_ANT and FDD_HB_TRX1 (frequency-division duplex, high-band, transceiver channel 1) through M1. Similarly, switch S2 is shown to provide a switchable path between HB_ANT and FDD_HB_TRX2 (frequency-division duplex, high-band, transceiver channel 2) through M2. Similarly, switch S3 is shown to provide a switchable path between HB_ANT and FDD_HB_TRX3 (frequency-division duplex, high-band, transceiver channel 3) through M3.

In the example of FIG. 6, switch S4 is shown to provide a switchable path between HB_ANT and a quadruplexer 20 that includes a B1 duplexer and a B7 duplexer. The B1 duplexer is shown to be coupled to S4 through M4A, and the B7 duplexer is shown to be coupled to S4 through M4B. The B1 duplexer is shown to provide B1Tx/B1Rx duplex functionality, and the B7 duplexer is shown to provide B7Tx/B7Rx duplex functionality.

In the example of FIG. 6, switch S5 is shown to provide a switchable path between HB_ANT and a B3 duplexer. The B3 duplexer is shown to be coupled to S5 through M5. The B3 duplexer is shown to provide B3Tx/B3Rx duplex functionality.

In the example of FIG. 6, switch S6 is shown to provide a switchable path between HB_ANT and a quadruplexer 22 that includes a B2 duplexer and a B4 duplexer. The B2 duplexer is shown to be coupled to S6 through M6A, and the B4 duplexer is shown to be coupled to S6 through M6B. The B2 duplexer is shown to provide B2Tx/B2Rx duplex functionality, and the B4 duplexer is shown to provide B4Tx/B4Rx duplex functionality.

In the example of FIG. 6, switch S7 is shown to provide a switchable path between HB_ANT and a filter for B30 or B34. The B30/B34 filter is shown to be coupled to S7 through M7. The B30/B34 filter is shown to provide filtering functionality for Tx and Rx signals for B30 or B34.

In the example of FIG. 6, switch S8 is shown to provide a switchable path between HB_ANT and a filter for B39. The B39 filter is shown to be coupled to S8 through M8. The B39 filter is shown to provide filtering functionality for Tx and Rx signals for B39.

In the example of FIG. 6, switch S9 is shown to provide a switchable path between HB_ANT and a filter for B38 and B41B. The B38/B41B filter is shown to be coupled to S9 through M9. The B38/B41B filter is shown to provide filtering functionality for Tx and Rx signals for B38 and/or B41B.

In the example of FIG. 6, switch S10 is shown to provide a switchable path between HB_ANT and a duplexer for B40A and B41A. The B40A+B41A duplexer is shown to be coupled to 510 through M10. The B40A+B41A duplexer is shown to provide B40A_TRX/B41A_TRX duplex functionality.

In the example of FIG. 6, switch S11 is shown to provide a switchable path between HB_ANT and a duplexer for B40B and B41C. The B40B+B41C duplexer is shown to be coupled to S11 through M11. The B40B+B41C duplexer is shown to provide B40B_TRX/B41C_TRX duplex functionality.

In the example of FIG. 6, switch S12 is shown to provide a switchable path between HB_ANT and TDD_2GHB_Tx through M12. TDD_2GHB_Tx supports a 2G time-division duplex high-band signal for transmission.

In the example of FIG. 6, switch T1 is shown to provide a switchable path between LB_ANT and a quadruplexer 24 that includes a B5 duplexer and a B12 duplexer. The B5 duplexer is shown to be coupled to T1 through N1A, and the B12 duplexer is shown to be coupled to T1 through N1B. The B5 duplexer is shown to provide B5Tx/B5Rx duplex functionality, and the B12 duplexer is shown to provide B12Tx/B12Rx duplex functionality.

In the example of FIG. 6, switch T2 is shown to provide a switchable path between LB_ANT and a B13 duplexer. The B13 duplexer is shown to be coupled to T2 through N2. The B13 duplexer is shown to provide B13Tx/B13Rx duplex functionality.

In the example of FIG. 6, switch T3 is shown to provide a switchable path between LB_ANT and a quadruplexer 26 that includes a B8 duplexer and a B20 duplexer. The B8 duplexer is shown to be coupled to T3 through N3A, and the B20 duplexer is shown to be coupled to T3 through N3B. The B8 duplexer is shown to provide B8Tx/B8Rx duplex functionality, and the B20 duplexer is shown to provide B20Tx/B20Rx duplex functionality.

In the example of FIG. 6, switch T4 is shown to provide a switchable path between LB_ANT and FDD_LB_TRX1 (frequency-division duplex, low-band, transceiver channel 1) through N4. Similarly, switch T5 is shown to provide a switchable path between LB_ANT and FDD_LB_TRX2 (frequency-division duplex, low-band, transceiver channel 2) through N5.

In the example of FIG. 6, switch T6 is shown to provide a switchable path between LB_ANT and TDD_2GLB_Tx through N6. TDD_2GLB_Tx supports a 2G time-division duplex low-band signal for transmission.

As described in reference to FIG. 6, the two duplexers for B1 and B7 are electrically connected together to form the quadruplexer 20. Similarly, the quadruplexer 22 is formed by the two duplexers for B2 and B4; the quadruplexer 24 is formed by the two duplexers for B5 and B12; and the quadruplexer 26 is formed by the two duplexers for B8 and B20. While such a quadruplexer design is relatively easier to implement, there may be disadvantages. For example, insertion loss between the respective antenna (HB_ANT or LB_ANT) and the respective circuit (Tx or Rx) will be higher through such a quadruplexer (20, 22, 24 or 26) than insertion loss through an individual duplexer. Accordingly, such a configuration is not ideal for single band operation due to higher insertion loss which typically translates to lower battery life and reduced RF signal reception performance in mobile devices. It is also noted that the example configuration of FIG. 6 typically does not fully support LTE carrier aggregation for the combinations B1+B7, B2+B4, B7+B3, B5+B12, B5+B17 and/or B8+B20.

Figure 7:
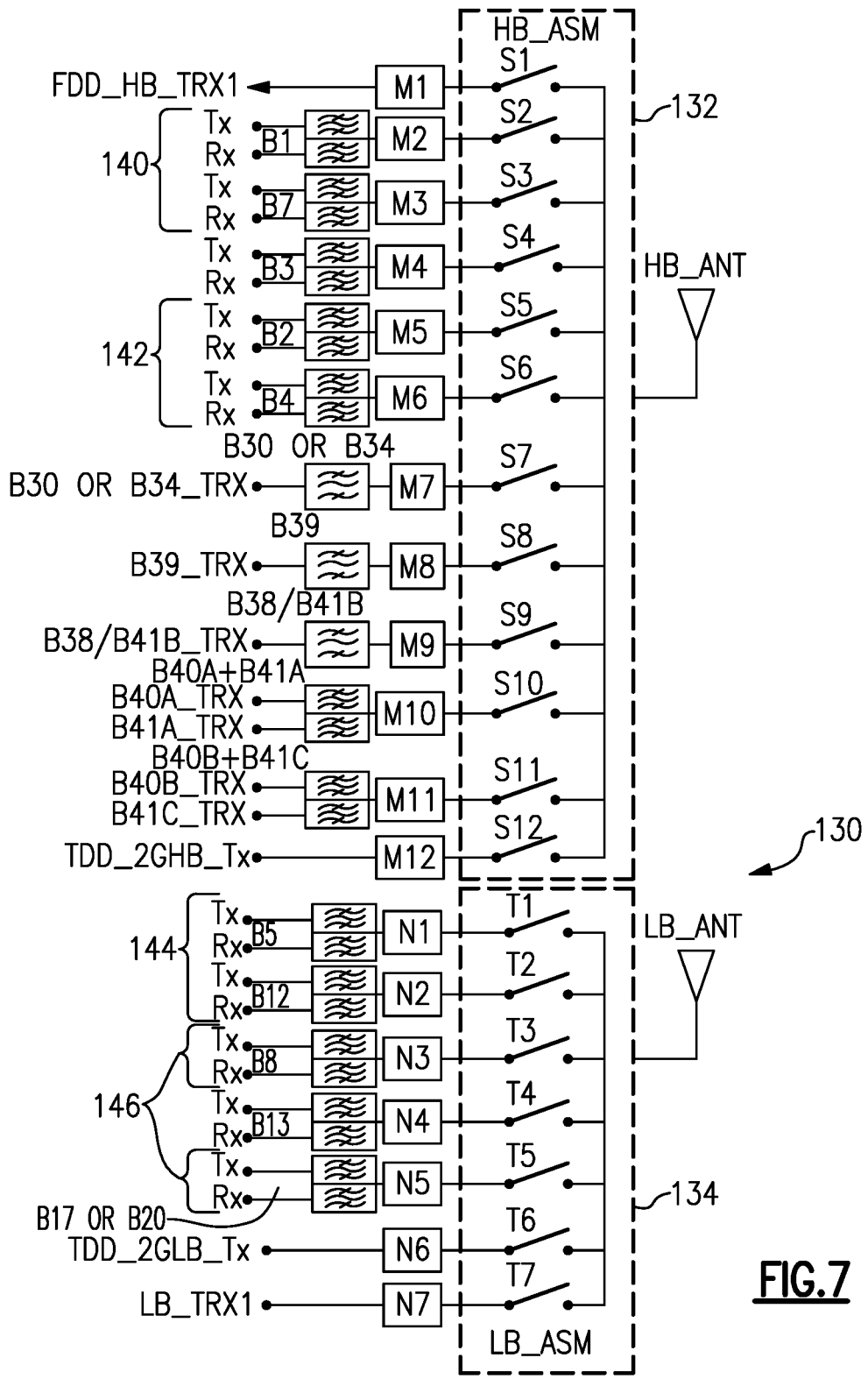
FIG. 7 shows an example of a FEM that utilizes a design having one or more features as described herein to, among others, support LTE carrier aggregation.

FIG. 7 shows an example of a front-end module (FEM) 130 that utilizes a design to, among others, support LTE carrier aggregation. The example FEM 130 is shown to include an antenna switch system having a high-band antenna switch module (ASM) (HB_ASM) 132 and a low-band ASM (LB_ASM) 134. The high-band ASM (HB_ASM) 132 is shown to provide switching functionality between a high-band antenna (HB_ANT) and a number of frequency band channels. The low-band ASM (LB_ASM) 134 is shown to provide switching functionality between a low-band antenna (LB_ANT) and a number of frequency band channels. In FIG. 7, each of circuits depicted as blocks M1, M2, M3, M4, M5, M6, M7, M8, M9, M10, M11, M12, N1, N2, N3, N4, N5, N6 and N7 can be configured to provide impedance matching and/or phase shifting functionality (e.g., utilizing L and/or C elements).

In the example of FIG. 7, switch S1 is shown to provide a switchable path between HB_ANT and FDD_HB_TRX1 (frequency-division duplex, high-band, transceiver channel 1) through M1. Although not shown, one or more other FDD_HB_TRX channels can be supported in a similar manner.

In the example of FIG. 7, switch S2 is shown to provide a switchable path between HB_ANT and a B1 duplexer. The B1 duplexer is shown to be coupled to S2 through M2. The B1 duplexer is shown to provide B1Tx/B1Rx duplex functionality. Similarly, switch S3 is shown to provide a switchable path between HB_ANT and a B7 duplexer. The B7 duplexer is shown to be coupled to S3 through M3. The B7 duplexer is shown to provide B7Tx/B7Rx duplex functionality.

In the foregoing example of B1 and B7 duplexers and their respective switches S2 and S3, such a combination (indicated as 140) can provide, among others, multiplexing functionality of the example quadruplexer 20 of FIG. 6. Further, because each of the B1 and B7 duplexers has associated with it a separate switch (S2, S3), operation of one duplexer (B1 or B7) can be achieved independently from the other duplexer (B7 or B1). Other advantageous features associated with the combination 140 are described herein in greater detail.

In the example of FIG. 7, switch S4 is shown to provide a switchable path between HB_ANT and a B3 duplexer. The B3 duplexer is shown to be coupled to S4 through M4. The B3 duplexer is shown to provide B3Tx/B3Rx duplex functionality.

In the example of FIG. 7, switch S5 is shown to provide a switchable path between HB_ANT and a B2 duplexer. The B2 duplexer is shown to be coupled to S5 through M5. The B2 duplexer is shown to provide B2Tx/B2Rx duplex functionality. Similarly, switch S6 is shown to provide a switchable path between HB_ANT and a B4 duplexer. The B4 duplexer is shown to be coupled to S6 through M6. The B4 duplexer is shown to provide B4Tx/B4Rx duplex functionality.

In the foregoing example of B2 and B4 duplexers and their respective switches S5 and S6, such a combination (indicated as 142) can provide, among others, multiplexing functionality of the example quadruplexer 22 of FIG. 6. Further, because each of the B2 and B4 duplexers has associated with it a separate switch (S5, S6), operation of one duplexer (B2 or B4) can be achieved independently from the other duplexer (B4 or B2). Other advantageous features associated with the combination 142 are described herein in greater detail.

In the example of FIG. 7, switch S7 is shown to provide a switchable path between HB_ANT and a filter for B30 or B34. The B30/B34 filter is shown to be coupled to S7 through M7. The B30/B34 filter is shown to provide filtering functionality for Tx and Rx signals for B30 or B34.

In the example of FIG. 7, switch S8 is shown to provide a switchable path between HB_ANT and a filter for B39. The B39 filter is shown to be coupled to S8 through M8. The B39 filter is shown to provide filtering functionality for Tx and Rx signals for B39.

In the example of FIG. 7, switch S9 is shown to provide a switchable path between HB_ANT and a filter for B38 and B41B. The B38/B41B filter is shown to be coupled to S9 through M9. The B38/B41B filter is shown to provide filtering functionality for Tx and Rx signals for B38 and/or B41B.

In the example of FIG. 7, switch S10 is shown to provide a switchable path between HB_ANT and a duplexer for B40A and B41A. The B40A+B41A duplexer is shown to be coupled to S10 through M10. The B40A+B41A duplexer is shown to provide B40A_TRX/B41A_TRX duplex functionality.

In the example of FIG. 7, switch S11 is shown to provide a switchable path between HB_ANT and a duplexer for B40B and B41C. The B40B+B41C duplexer is shown to be coupled to S11 through M11. The B40B+B41C duplexer is shown to provide B40B_TRX/B41C_TRX duplex functionality.

In the example of FIG. 7, switch S12 is shown to provide a switchable path between HB_ANT and TDD_2GHB_Tx through M12. TDD_2GHB_Tx supports a 2G time-division duplex high-band signal for transmission.

In the example of FIG. 7, switch T1 is shown to provide a switchable path between LB_ANT and a B5 duplexer. The B5 duplexer is shown to be coupled to T1 through N1. The B5 duplexer is shown to provide B5Tx/B5Rx duplex functionality. Similarly, switch T2 is shown to provide a switchable path between LB_ANT and a B12 duplexer. The B12 duplexer is shown to be coupled to T2 through N2. The B12 duplexer is shown to provide B12Tx/B12Rx duplex functionality.

In the foregoing example of B5 and B12 duplexers and their respective switches T1 and T2, such a combination (indicated as 144) can provide, among others, multiplexing functionality of the example quadruplexer 24 of FIG. 6. Further, because each of the B5 and B12 duplexers has associated with it a separate switch (T1, T2), operation of one duplexer (B5 or B12) can be achieved independently from the other duplexer (B12 or B5). Other advantageous features associated with the combination 144 are described herein in greater detail.

In the example of FIG. 7, switch T3 is shown to provide a switchable path between LB_ANT and a B8 duplexer. The B8 duplexer is shown to be coupled to T3 through N3. The B8 duplexer is shown to provide B8Tx/B8Rx duplex functionality. Similarly, switch T5 is shown to provide a switchable path between LB_ANT and a duplexer for B17 or B20. The B17/B20 duplexer is shown to be coupled to T5 through N5. The B12 duplexer is shown to provide B17Tx/B17Rx or B20Tx/B20Rx duplex functionality.

In the foregoing example of B8 and B17/B20 duplexers and their respective switches T3 and T5, such a combination (indicated as 146) can provide, among others, multiplexing functionality of the example quadruplexer 26 of FIG. 6. Further, because each of the B8 and B17/B20 duplexers has associated with it a separate switch (T3, T5), operation of one duplexer (B8 or B17/B20) can be achieved independently from the other duplexer (B17/B20 or B8). It is further noted that because of the B17/B20 duplexer's capability of providing duplexing for B17 or B20, additional multiplexing flexibility can be realized. Other advantageous features associated with the combination 146 are described herein in greater detail.

In the example of FIG. 7, switch T4 is shown to provide a switchable path between LB_ANT and a B13 duplexer. The B13 duplexer is shown to be coupled to T4 through N4. The B13 duplexer is shown to provide B13Tx/B13Rx duplex functionality.

In the example of FIG. 7, switch T6 is shown to provide a switchable path between LB_ANT and TDD_2GLB_Tx through N6. TDD_2GLB_Tx supports a 2G time-division duplex low-band signal for transmission.

In the example of FIG. 7, switch T7 is shown to provide a switchable path between LB_ANT and LB_TRX1 (low-band, transceiver channel 1) through N7. Although not shown, one or more other LB_TRX channels can be supported in a similar manner.

As described in reference to FIG. 7, quadruplexing functionality can be achieved by configuring selected switches in the ASM (132 and/or 134) associated with two duplexers. For example, quadruplexing functionality (depicted as 140) for B1 and B7 can be achieved by turning ON each of the switches S2 and S3. In another example, quadruplexing functionality (depicted as 142) for B2 and B4 can be achieved by turning ON each of the switches S5 and S6. In yet another example, quadruplexing functionality (depicted as 144) for B5 and B12 can be achieved by turning ON each of the switches T1 and T2. In yet another example, quadruplexing functionality (depicted as 146) for B8 and B20 can be achieved by turning ON each of the switches T3 and T5.

The foregoing examples of quadruplexing configurations 140, 142, 144, 146 are those that correspond to the example quadruplexers 20, 22, 24, 26 of FIG. 6. Other quadruplexing configurations can be formed in the example of FIG. 7. For example, quadruplexing functionality for B3 and B7 can be achieved by turning ON each of the switches S4 and S3. In another example, quadruplexing functionality for B5 and B17 can be achieved by turning ON each of the switches T1 and T5.

In the context of the foregoing B3+B7 quadruplexing functionality, it is noted that for the configuration of FIG. 6 to achieve such a functionality, the switches S4 and S5 (in FIG. 6) can be turned ON. However, because S4 (of FIG. 6) is already tied to the quadruplexer 20, the B3+B7 quadruplexing functionality is either not possible (e.g., due to the presence of B1 in the quadruplexer 20), or suffers from an increased insertion loss associated with the quadruplexer 20. Similarly, in the context of the foregoing B5+B17 quadruplexing functionality, it is noted that in the configuration of FIG. 6, B5 is tied to B12 in the quadruplexer 24. Accordingly, the B5+B17 quadruplexing functionality is either not possible (e.g., due to the presence of B12 in the quadruplexer 24), or suffers from an increased insertion loss associated with the quadruplexer 24.

The example switched multiplexer design of FIG. 7 can provide a number of significant benefits. For example, an insertion loss between the respective antenna (HB_ANT or LB_ANT) and the respective circuit (Tx or Rx) in a quadruplexing configuration can be similar to an insertion loss associated with an individual duplexer. Further, the example configuration of FIG. 7 can fully support LTE carrier aggregation for the combinations B1+B7, B2+B4, B7+B3, B5+B12, B5+B17 and/or B8+B20. Accordingly, such benefits can include, for example, eliminating or reducing the need for designing and implementing multiple parts to support wireless operations in different regions.

Figure 8:
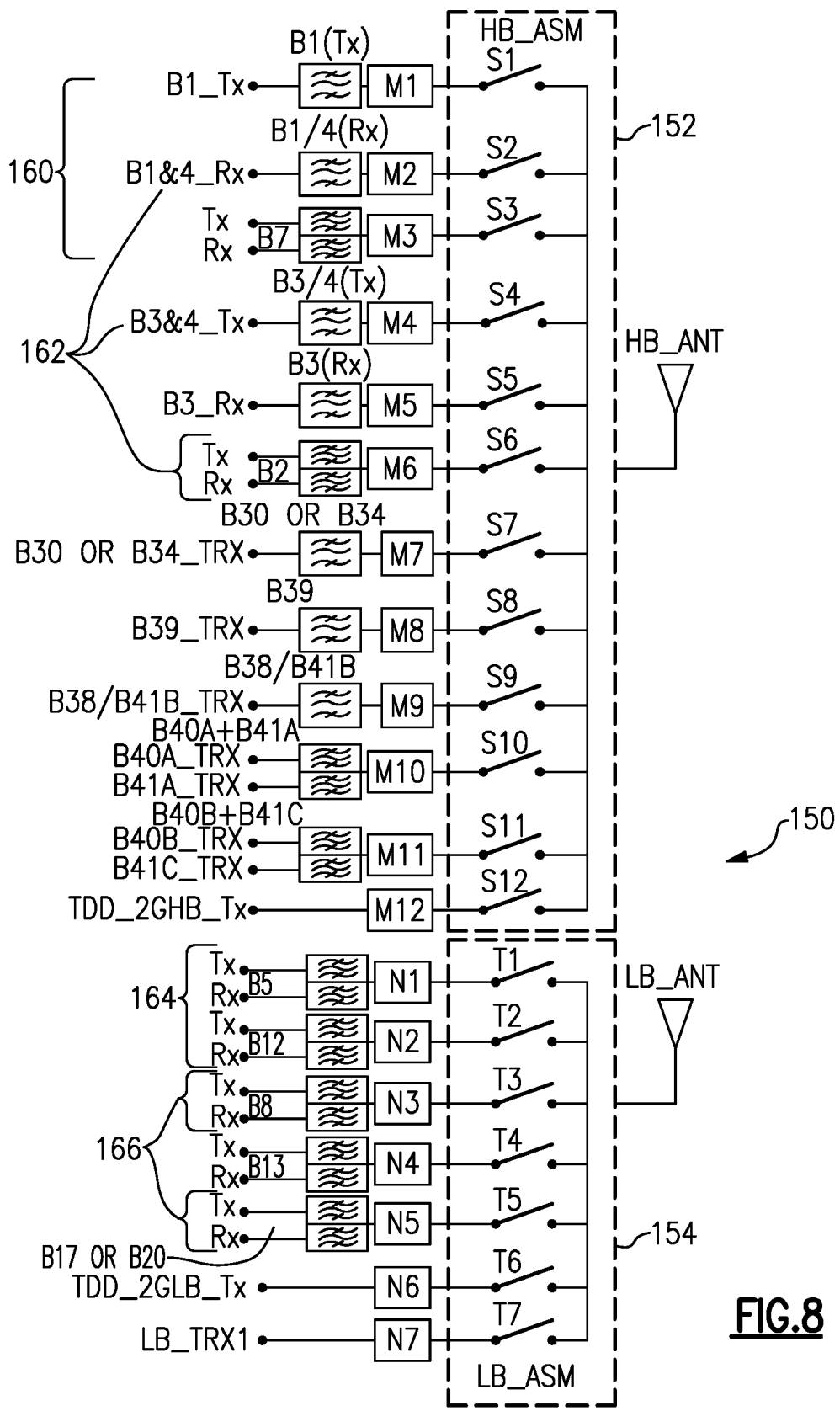
FIG. 8 shows another example of a FEM that utilizes a design having one or more features as described herein to, among others, support LTE carrier aggregation.

FIG. 8 shows another example of a front-end module (FEM) 150 that utilizes a design to, among others, support LTE carrier aggregation. The example FEM 150 is shown to include an antenna switch system having a high-band antenna switch module (ASM) (HB_ASM) 152 and a low-band ASM (LB_ASM) 154. The high-band ASM (HB_ASM) 152 is shown to provide switching functionality between a high-band antenna (HB_ANT) and a number of frequency band channels. The low-band ASM (LB_ASM) 154 is shown to provide switching functionality between a low-band antenna (LB_ANT) and a number of frequency band channels. In FIG. 8, each of circuits depicted as blocks M1, M2, M3, M4, M5, M6, M7, M8, M9, M10, M11, M12, N1, N2, N3, N4, N5, N6 and N7 can be configured to provide impedance matching and/or phase shifting functionality (e.g., utilizing L and/or C elements).

In the example of FIG. 8, switch S1 is shown to provide a switchable path between HB_ANT and a B1(Tx) filter through M1. Switch S2 is shown to provide a switchable path between HB_ANT and an Rx filter for B1 and B4 through M2. Switch S3 is shown to provide a switchable path between HB_ANT and a B7 duplexer through M3. The B7 duplexer is shown to provide B7Tx/B7Rx duplex functionality.

In the foregoing example, a combination of the B1 filters (B1(Tx) and B1/4(Rx)), the B7 duplexer and their respective switches S1, S2 and S3, can provide, among others, multiplexing functionality (depicted as 160) of the example quadruplexer 20 of FIG. 6. Further, because each of the B1 filters and the B7 duplexer has associated with it a separate switch (S1, S2, S3), operation of one path can be achieved independently from the other paths. Other advantageous features associated with the combination 160 are described herein in greater detail.

In the example of FIG. 8, switch S4 is shown to provide a switchable path between HB_ANT and a Tx filter for B3 and B4 through M4. Switch S5 is shown to provide a switchable path between HB_ANT and a B3(Rx) filter through M5. Switch S6 is shown to provide a switchable path between HB_ANT and a B2 duplexer through M6. The B2 duplexer is shown to provide B2Tx/B2Rx duplex functionality.

As shown in FIG. 8, a combination of the Tx and Rx filters for B4 (e.g., B3/4(Tx) and B1/4(Rx)), the B2 duplexer and their respective switches S4, S2 and S6, can provide, among others, multiplexing functionality (depicted as 162) of the example quadruplexer 22 of FIG. 6. Further, because each of the B4 filters and the B2 duplexer has associated with it a separate switch (S4, S2, S6), operation of one path can be achieved independently from the other paths. Other advantageous features associated with the combination 162 are described herein in greater detail.

In the example of FIG. 8, switch S7 is shown to provide a switchable path between HB_ANT and a filter for B30 or B34. The B30/B34 filter is shown to be coupled to S7 through M7. The B30/B34 filter is shown to provide filtering functionality for Tx and Rx signals for B30 or B34.

In the example of FIG. 8, switch S8 is shown to provide a switchable path between HB_ANT and a filter for B39. The B39 filter is shown to be coupled to S8 through M8. The B39 filter is shown to provide filtering functionality for Tx and Rx signals for B39.

In the example of FIG. 8, switch S9 is shown to provide a switchable path between HB_ANT and a filter for B38 and B41B. The B38/B41B filter is shown to be coupled to S9 through M9. The B38/B41B filter is shown to provide filtering functionality for Tx and Rx signals for B38 and/or B41B.

In the example of FIG. 8, switch S10 is shown to provide a switchable path between HB_ANT and a duplexer for B40A and B41A. The B40A+B41A duplexer is shown to be coupled to S10 through M10. The B40A+B41A duplexer is shown to provide B40A_TRX/B41A_TRX duplex functionality.

In the example of FIG. 8, switch S11 is shown to provide a switchable path between HB_ANT and a duplexer for B40B and B41C. The B40B+B41C duplexer is shown to be coupled to S11 through M11. The B40B+B41C duplexer is shown to provide B40B_TRX/B41C_TRX duplex functionality.

In the example of FIG. 8, switch S12 is shown to provide a switchable path between HB_ANT and TDD_2GHB_Tx through M12. TDD_2GHB_Tx supports a 2G time-division duplex high-band signal for transmission.

In the example of FIG. 8, switch T1 is shown to provide a switchable path between LB_ANT and a B5 duplexer. The B5 duplexer is shown to be coupled to T1 through N1. The B5 duplexer is shown to provide B5Tx/B5Rx duplex functionality. Similarly, switch T2 is shown to provide a switchable path between LB_ANT and a B12 duplexer. The B12 duplexer is shown to be coupled to T2 through N2. The B12 duplexer is shown to provide B12Tx/B12Rx duplex functionality.

In the foregoing example of B5 and B12 duplexers and their respective switches T1 and T2, such a combination (indicated as 164) can provide, among others, multiplexing functionality of the example quadruplexer 24 of FIG. 6. Further, because each of the B5 and B12 duplexers has associated with it a separate switch (T1, T2), operation of one duplexer (B5 or B12) can be achieved independently from the other duplexer (B12 or B5). Other advantageous features associated with the combination 164 are described herein in greater detail.

In the example of FIG. 8, switch T3 is shown to provide a switchable path between LB_ANT and a B8 duplexer. The B8 duplexer is shown to be coupled to T3 through N3. The B8 duplexer is shown to provide B8Tx/B8Rx duplex functionality. Similarly, switch T5 is shown to provide a switchable path between LB_ANT and a duplexer for B17 or B20. The B17/B20 duplexer is shown to be coupled to T5 through N5. The B12 duplexer is shown to provide B17Tx/B17Rx or B20Tx/B20Rx duplex functionality.

In the foregoing example of B8 and B17/B20 duplexers and their respective switches T3 and T5, such a combination (indicated as 166) can provide, among others, multiplexing functionality of the example quadruplexer 26 of FIG. 6. Further, because each of the B8 and B17/B20 duplexers has associated with it a separate switch (T3, T5), operation of one duplexer (B8 or B17/B20) can be achieved independently from the other duplexer (B17/B20 or B8). It is further noted that because of the B17/B20 duplexer's capability of providing duplexing for B17 or B20, additional multiplexing flexibility can be realized. Other advantageous features associated with the combination 166 are described herein in greater detail.

In the example of FIG. 8, switch T4 is shown to provide a switchable path between LB_ANT and a B13 duplexer. The B13 duplexer is shown to be coupled to T4 through N4. The B13 duplexer is shown to provide B13Tx/B13Rx duplex functionality.

In the example of FIG. 8, switch T6 is shown to provide a switchable path between LB_ANT and TDD_2GLB_Tx through N6. TDD_2GLB_Tx supports a 2G time-division duplex low-band signal for transmission.

In the example of FIG. 8, switch T7 is shown to provide a switchable path between LB_ANT and LB_TRX1 (low-band, transceiver channel 1) through N7. Although not shown, one or more other LB_TRX channels can be supported in a similar manner.

As described in reference to FIG. 8, quadruplexing functionality can be achieved by configuring selected switches in the ASM (132 and/or 134) associated with a combination of filters and/or duplexers. For example, quadruplexing functionality (depicted as 160) for B1 and B7 can be achieved by turning ON each of the switches S1, S2 and S3. In another example, quadruplexing functionality (depicted as 162) for B2 and B4 can be achieved by turning ON each of the switches S6, S4 and S2. In yet another example, quadruplexing functionality (depicted as 164) for B5 and B12 can be achieved by turning ON each of the switches T1 and T2. In yet another example, quadruplexing functionality (depicted as 166) for B8 and B20 can be achieved by turning ON each of the switches T3 and T5.

The foregoing examples of quadruplexing configurations 160, 162, 164, 166 are those that correspond to the example quadruplexers 20, 22, 24, 26 of FIG. 6. Other quadruplexing configurations can be formed in the example of FIG. 8. For example, quadruplexing functionality for B3 and B7 can be achieved by turning ON each of the switches S4, S5 and S3. In another example, quadruplexing functionality for B5 and B17 can be achieved by turning ON each of the switches T1 and T5.

FIG. 8 shows that duplexing functionality can be achieved by configuring selected switches in the ASM (132 and/or 134) associated with a combination of individual filters. For example, duplexing functionality for B1 can be achieved by turning ON each of the switches S1 and S2. In another example, duplexing functionality for B3 can be achieved by turning ON each of the switches S4 and S5. In yet another example, duplexing functionality for B4 can be achieved by turning ON each of the switches S4 and S2.

The example switched multiplexer design of FIG. 8 can provide a number of significant benefits. For example, an insertion loss between the respective antenna (HB_ANT or LB_ANT) and the respective circuit (Tx or Rx) in a quadruplexing configuration can be similar to an insertion loss associated with an individual duplexer when two duplexers are utilized.

When duplexing and/or multiplexing functionality is achieved by individual filters, advantageous features such as increased flexibility and/or additional improvement in insertion loss performance can be obtained. For example, in FIG. 8, B4 duplexer has been removed, and similar functionality can be provided by individual filters (e.g., B3/4(Tx) and B1/4(Rx) filters. For such filters where each of the B3/B4 Tx pair and the B1/B4 Rx pair can be co-banded (e.g., with no B4 Rx routing), reduction in cost and/or size of FEMs can be realized. In another example, by physically separating the Tx and Rx filters for B1 and B3, common ground inductor and coupling between Tx and Rx filters can be eliminated. Accordingly, Tx-Rx isolation of B1, B3 and B4 can yield an improvement in performance over the example of FIG. 6.

It is also noted that the example configuration of FIG. 8 can fully support LTE carrier aggregation for the combinations B1+B7, B2+B4, B7+B3, B5+B12, B5+B17 and/or B8+B20. Accordingly, benefits associated with the example of FIG. 8 can include, for example, eliminating or reducing the need for designing and implementing multiple parts to support wireless operations in different regions.

In the examples of FIGS. 7 and 8, various switches in the ASMs can be controlled through, for example, Mobile Industry Processor Interface (MIPI). For example, switches S1-S12 and T1-T7 of FIG. 7 and switches S1-S12 and T1-T7 of Figure can be controlled by MIPI. Other control techniques can also be utilized.

In some embodiments, a switched multiplexer can be configured to improve performance of a difficult band. For example, filters for B25 are typically heavily constrained due to a very narrow duplex gap, and designs typically do not have the degrees of freedom needed or desired to absorb additional matching requirements of a quadruplexer.

Figure 9:
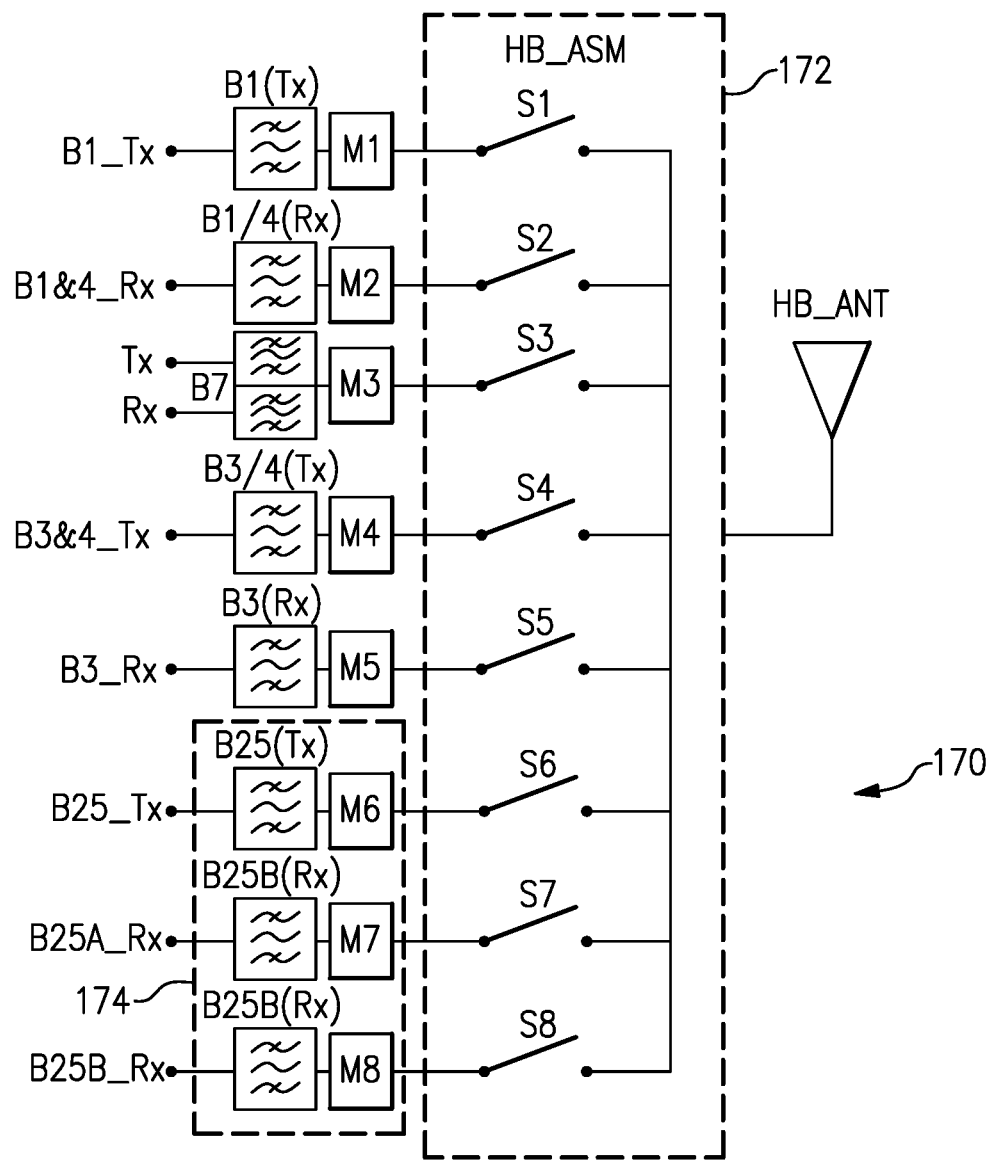
FIG. 9 shows an example of a switched multiplexing configuration for supporting LTE carrier aggregation for B25+B4, B1+B7 and B3+B7.

FIG. 9 shows an example of a switched multiplexing configuration 170 that can be implemented to support LTE carrier aggregation for B25+B4, B1+B7 and B3+B7. In the example of FIG. 9, filtering for B25Rx is shown to be split into B25A_Rx and B25B_Rx filters to reduce Ant_Rx insertion loss (e.g. between the antenna HB_ANT and B25Rx circuits). To form quadruplexing functionality for the B25+134 combination, switches S7, S8 on an ASM (HB_ASM) 172 and associated with the B25A_Rx and B25B_Rx filters, switch S6 on the ASM 172 and associated with a B25_Tx filter, and switches S4, S2 on the ASM 172 and associated with B3/4_Tx and B1/4_Rx filters can be operated to yield desirable quadruplexing functionalities. For example, S6, S7, S4 and S2 can be turned ON to form a B25A+B4 quadruplexer. In another example, S6, S8, S4 and S2 can be turned ON to form a B25B+B4 quadruplexer.

In some embodiments, filters such as B25A_Rx and B25B_Rx can be implemented with silicon-on-insulator (SOI) technology instead of more costly thin-film bulk acoustic resonator (FBAR) technology.

In some embodiments, a switched multiplexer can be configured to provide improved performance of harmonics radiation at an antenna. For example, a second harmonic ($2f_0$) of B8 Tx can fall in B3 Rx, such that B8 Tx harmonics generated by a PA can leak into LB_ANT and couple into HB_ANT. Accordintly, more robust $2f_0$ rejection at LB_ANT for B8 can be desirable.

An option to address such a harmonic problem is to add a low-pass filter (LPF) at LB_ANT. However, such an addition can incur additional loss for all other LBs.

Figure 10:
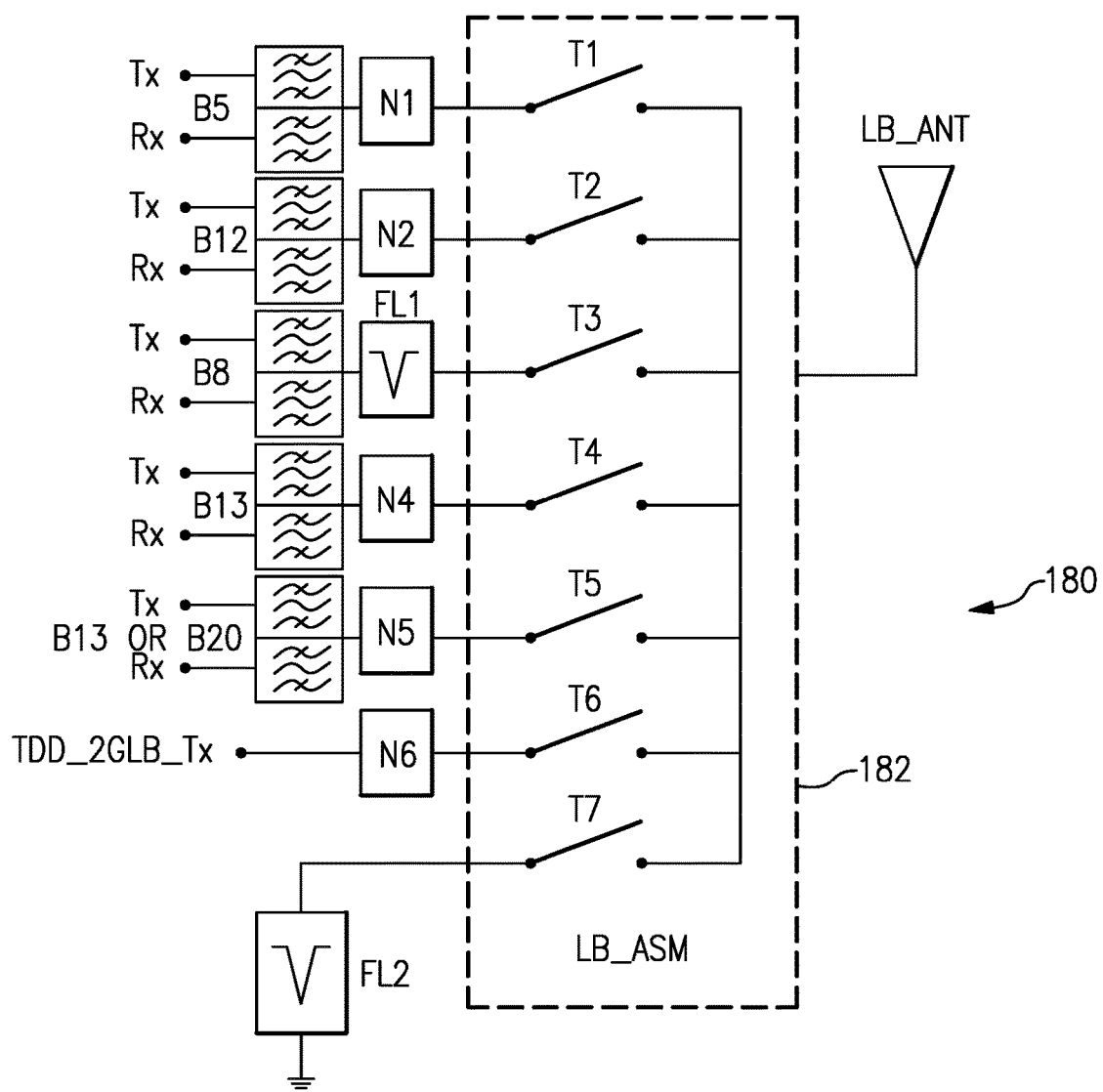
FIG. 10 shows an example of a switched multiplexing configuration that can address a harmonic problem.

FIG. 10 shows an example of a switched multiplexing configuration 180 that can address the foregoing harmonic problem. In such a configuration, rejection of the second harmonic ($2f_0$) of B8 can be achieved through switches on an ASM 182 without incurring significant additional loss for all other LBs. For example, filter FL1 can be implemented between a B8 duplexer and a switch T3 of the ASM 182. The switch T3 is shown to provide a switchable path between the B8 duplexer and the antenna LB_ANT.

The filter FL1 can be configured as, for example, a $2f_0$ notch filter. When the switch T3 is turned ON, such a filter (FL1) can provide rejection of $2f_0$ at the antenna LB_ANT. In some embodiments, a second filter FL2 (e.g., a $2f_0$ notch filter) can provide a shunt path to ground from the antenna LB_ANT and through a switch T7 on the ASM 182. Thus, when the switch T3 is turned ON, the switch T7 can also be turned on to provide additional rejection of 2fo at the antenna LB_ANT.

Accordingly, one can see that by utilizing filter switching as shown by way of examples in FIG. 10, removal (e.g., by notching out) of unwanted signals. As also described herein, such removal of unwanted signals can be achieved while incurring little or minimum loss.

Figure 11:
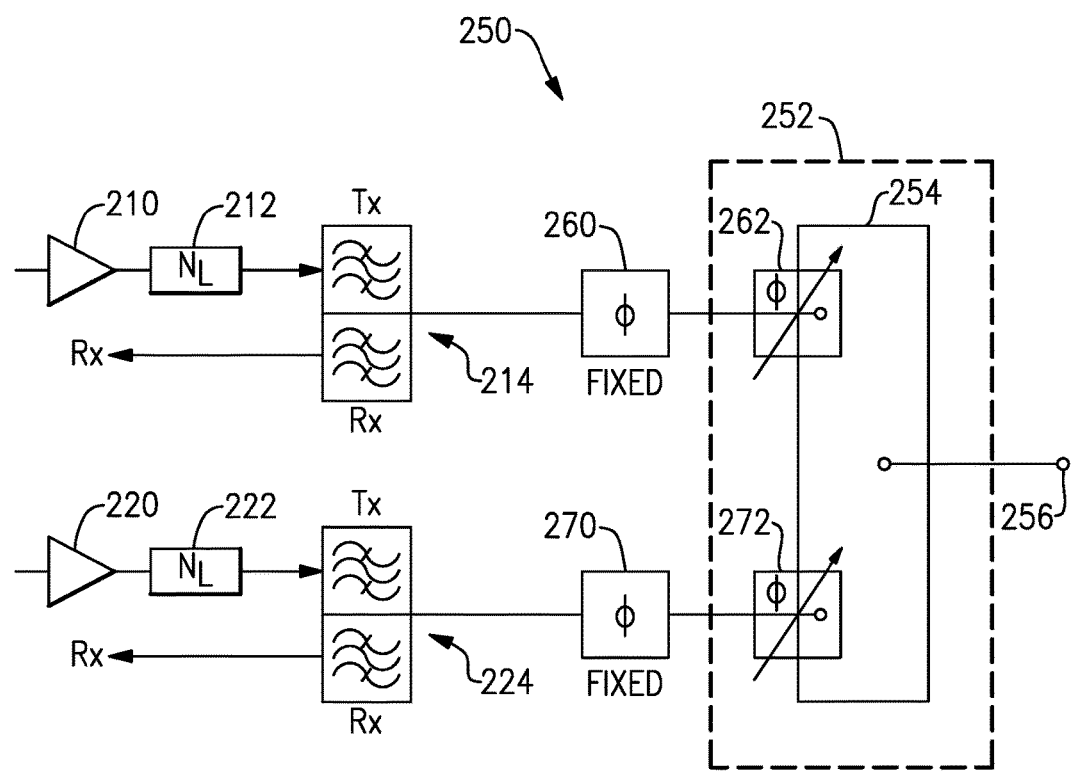
FIG. 11 shows an example switched-in filter configuration that includes a duplexer coupled to its corresponding switch on an antenna switch module (ASM) through a fixed phase shifting circuit and a tunable phase shifting circuit.

In the various examples described in reference to FIGS. 3-10, a circuit block between a quadruplexer, a duplexer, or a filter and a corresponding switch in an ASM is described as, for example, an impedance matching circuit, a phase shifting (e.g., phase delay) circuit, or a filter (e.g., a notch filter) circuit. FIG. 11 shows that in some embodiments, such a phase shifting circuit can be configured to provide adjustable or tunable phase.

In FIG. 11, an example switched-in filter configuration 250 is shown to include a first duplexer 214 coupled to its corresponding switch on an ASM 252 through a fixed phase shifting circuit 260 and a tunable phase shifting circuit 262. As described herein, such a switch on the ASM can provide a switchable path between the first duplexer 214 and an antenna port 256. Similarly, a second duplexer 224 is shown to be coupled to its corresponding switch on the ASM 252 through a fixed phase shifting circuit 270 and a tunable phase shifting circuit 272.

As described herein, such a switch on the ASM can provide a switchable path between the second duplexer 224 and the antenna port 256. As described herein, operation of the switches for the first and second duplexers 214, 224 can allow the two duplexers to operate as a quadruplexer (e.g., when both switches are turned ON).

In the example of FIG. 11, the first duplexer 214 is shown to facilitate transmission of an RF signal from a power amplifier 210 through a matching network 212. The first duplexer 214 is also shown to facilitate passage of a first Rx signal. Similarly, the second duplexer 224 is shown to facilitate transmission of an RF signal from a power amplifier 220 through a matching network 222; and also facilitate passage of a second Rx signal. Although described in the context of duplexers, it will be understood that such switched-in components can also include a filter without duplexing capability.

In some embodiments, each of the fixed phase shifting circuits 260, 270 can also be configured to provide harmonic shunt capability for filtering functionality. An example of such a configuration is described herein in reference to FIG. 10.

In some embodiments, each of the tunable phase shifting circuits 262, 272 can be configured to be electrically tunable to yield a desirable phase and/or impedance. Such electrical tunability can be facilitated by, for example, a tunable-phase array that includes digitally switched capacitances (e.g., capacitors) arranged in series and/or in shunt configurations. In some embodiments, such an array of capacitors can be implemented on the ASM. In some embodiments, shunt capacitance can be implemented as a tunable phase shifting circuit, due to its relatively low insertion loss impact.

The foregoing example of phase tuning can facilitate important phase relationship between switched-in filters and/or duplexers as described herein. For example, series or shunt arrangements of capacitance can change the impedance and/or phase relationship between two (or more) filters and/or duplexers.

As described herein, a duplexer can be separated into Tx and Rx filters, and each of such filters can be coupled with an antenna through a separate switch in an ASM. As also described herein, a quadruplexer can be separated into duplexers, filters, or some combination thereof, and each of such separated components can be coupled with an antenna through a separate switch in an ASM.

As also described herein, the separate switches associated with the separated components (e.g., duplexers and/or filters) provides increased flexibility in how multiplexer (e.g., quadruplexer) and/or duplexer functionalities can be obtained. In some embodiments, such functionalities can be obtained with reduced insertion loss associated with the separated components.

Examples of Variations, Applications and Advantages:

In some implementations, one or more features of the present disclosure can be based on a concept of splitting a duplexer into separate TX and RX filters, which can then be electrically connected to one or more antenna ports through a switching network of an ASM. Such implementations can provide a number of advantageous features, and/or be applied in different applications.

For example, one or more features of the present disclosure can allow implementation of film bulk acoustic resonator (FBAR) duplexer functionality with desirable performance. Additionally, a number of advantageous features can be realized, including, for example, less expensive, more accessible, and/or potentially smaller surface acoustic wave (SAW) filter technology.

In another example, one or more features of the present disclosure can enable high isolation zero cross-over layouts for highly integrated FEMs. Such desirable performance can be realized by, for example, avoiding or reducing TX-RX, Ant-TX, and/or Ant-RX cross-overs often required or present in duplexer layouts.

In yet another example, one or more features of the present disclosure can allow enhanced isolation through increased physical separation of TX and RX components. For example, various examples described herein can include a reduced number of band filters, as well as a reduced number of receive and/or transmit ports. Accordingly, such reductions in TX and RX components can allow reduction in FEM footprint, increase in physical separation of the TX and RX components, or some combination thereof.

In yet another example, one or more features of the present disclosure can allow co-banding of different bands through frequency-division duplexing (FDD) filters. For example, 2G and time-division duplexing (TDD) systems can be co-banded through FDD RX filters, even in multi-band context. Such co-banding can be achieved with little or no penalty for duplexer filtering since it is switched out electrically thereby leaving only RX filter(s).

In yet another example, one or more features of the present disclosure can allow architectures that are capable of flexibly connecting to front-ends that utilize separate TX and RX antennas and/or antenna feeds. Such separate TX and RX antennas and/or antenna feeds can further enhance the isolation benefits provided by the antenna-to-antenna isolation.

In yet another example, one or more features of the present disclosure can allow implementation of electrically tunable ganging of filters to enable carrier-aggregation of difficult band combinations. For example, combinations such as B2/B4, B3/B7, B17/B5, etc. can be aggregated with little or no performance degradation when compared to their respective non-carrier-aggregated counterparts.

In yet another example, one or more features of the present disclosure can allow further segmentation of overlapping TX filters, thereby providing, for example, significant performance improvement by lowering of insertion loss and higher isolation at both TX and RX frequencies. Such a feature can provide an important performance benefit for or when compared to a non-carrier-aggregated system. Also, SAW technology with similar or better performance than FBAR technology can be utilized for bands and band combinations previously only thought possible with more costly FBAR technology.

In yet another example, one or more features of the present disclosure can justify additional overlapping filter segmentation that adds filter content for performance benefit. For example, such justification can be provided by one filter for both of B3 TX with B4 TX, and one filter for both of B1 RX with B4 RX.

In yet another example, one or more features of the present disclosure can allow foregoing filter segmentation to be extended to RX filters for potentially similar advantages. In some embodiments, both of TX and RX filters can be segmented.

In some embodiments, a switch associated with a filter as described herein can include an extra dedicated switch throw. Such a dedicated throw can be coupled to a shunt circuit configured to provide, for example, a desirable or additional inductance/reactance as needed or desired to match a filter combination. In some embodiments, such a shunt matching throw can also include, for example, one or more notches for additional harmonic filtering, and a desired impedance (e.g., 50 Ohms) for absorptive and/or shorts for isolation states.

Figure 12:
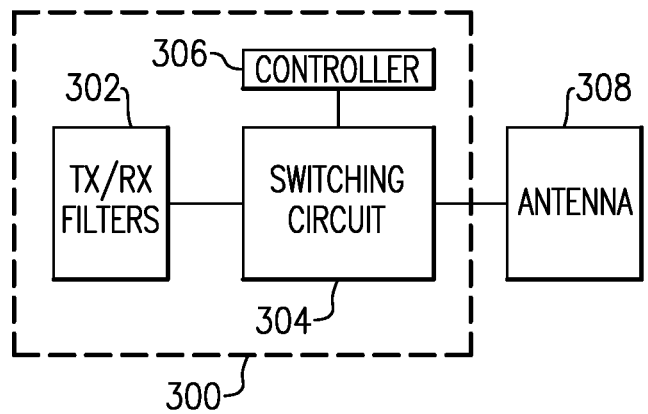
FIG. 12 shows that in some embodiments, one or more features of the present disclosure can be implemented in a FEM for a radio-frequency (RF) device such as a wireless device.

Examples of Product Implementations:

FIG. 12 shows that in some embodiments, one or more features of the present disclosure can be implemented in a front-end module (FEM) 300 for an RF device such as a wireless device. Such a FEM can include an assembly 302 of TX and RX filters having one or more features as described herein. The FEM 300 can also include a switching circuit 304 having one or more features as described herein. In some embodiments, control of the switching circuit 304 can be performed or facilitated by a controller 306. The FET 300 can be configured to be in communication with an antenna 308.

In some implementations, an architecture, a device and/or a circuit having one or more features described herein can be included in an RF device such as a wireless device. Such an architecture, a device and/or a circuit can be implemented directly in the wireless device, in one or more modular forms as described herein, or in some combination thereof. In some embodiments, such a wireless device can include, for example, a cellular phone, a smart-phone, a hand-held wireless device with or without phone functionality, a wireless tablet, a wireless router, a wireless access point, a wireless base station, etc.

Figure 13:
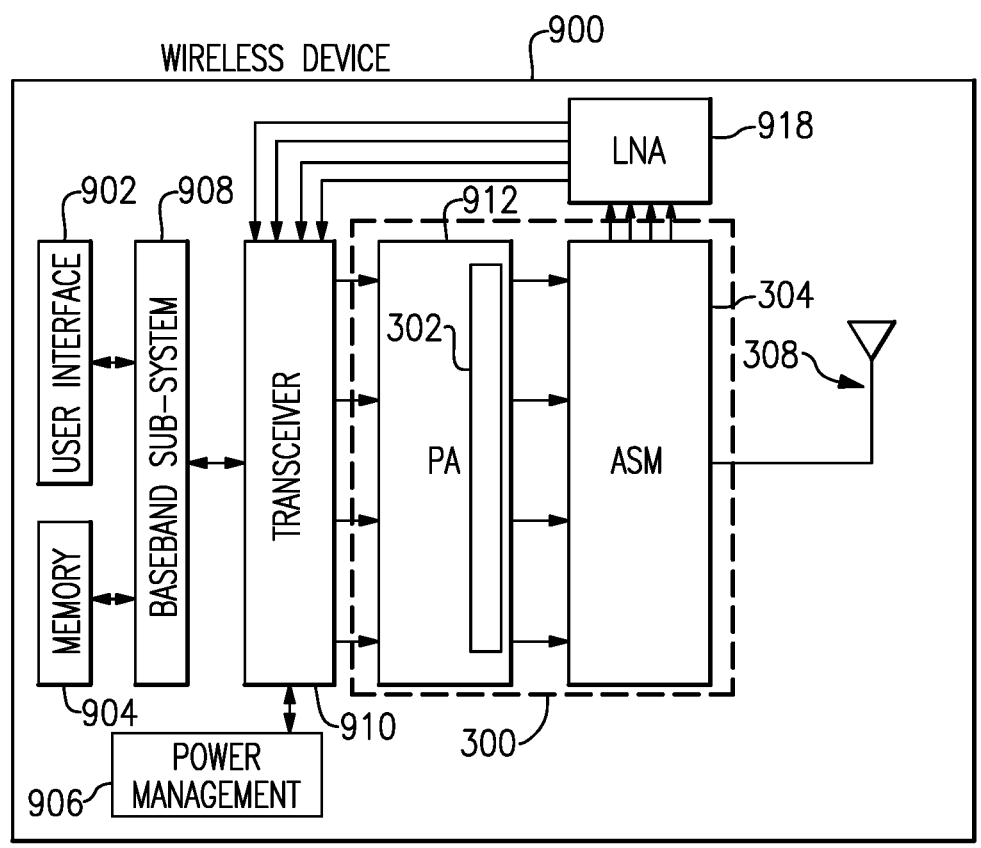
FIG. 13 schematically depicts an example wireless device having one or more advantageous features described herein.

FIG. 13 schematically depicts an example wireless device 900 having one or more advantageous features described herein. In some embodiments, such advantageous features can be implemented in a front-end (FE) module 300.

PAs in a PA module 912 can receive their respective RF signals from a transceiver 910 that can be configured and operated in known manners to generate RF signals to be amplified and transmitted, and to process received signals. The transceiver 910 is shown to interact with a baseband sub-system 908 that is configured to provide conversion between data and/or voice signals suitable for a user and RF signals suitable for the transceiver 910. The transceiver 910 is also shown to be connected to a power management component 906 that is configured to manage power for the operation of the wireless device 900. Such power management can also control operations of the baseband sub-system 908 and other components of the wireless device 900.

The baseband sub-system 908 is shown to be connected to a user interface 902 to facilitate various input and output of voice and/or data provided to and received from the user. The baseband sub-system 908 can also be connected to a memory 904 that is configured to store data and/or instructions to facilitate the operation of the wireless device, and/or to provide storage of information for the user.

In the example wireless device 900, the PA module 912 can include an assembly of filters (302) configured to provide duplexing/multiplexing functionalities as described herein. Such filters 302 can be in communication with an antenna switch module (ASM) 304 having one or more features as described herein. In some embodiments, functionalities such as band-selection and filtering of RF signals as described herein can be implemented in the filters 302 and/or the ASM 304. In FIG. 13, received signals are shown to be routed from the ASM 304 to one or more low-noise amplifiers (LNAs) 918. Amplified signals from the LNAs 918 are shown to be routed to the transceiver 910.

A number of other wireless device configurations can utilize one or more features described herein. For example, a wireless device does not need to be a multi-band device. In another example, a wireless device can include additional antennas such as diversity antenna, and additional connectivity features such as Wi-Fi, Bluetooth, and GPS.

One or more features of the present disclosure can be implemented with various cellular frequency bands as described herein. Examples of such bands are listed in Table 5. It will be understood that at least some of the bands can be divided into sub-bands. It will also be understood that one or more features of the present disclosure can be implemented with frequency ranges that do not have designations such as the examples of Table 5.

TABLE 5

| Band | Mode | Tx Frequency Range (MHz) | Rx Frequency Range (MHz) |
|---|---|---|---|
| B1 | FDD | 1,920-1,980 | 2,110-2,170 |
| B2 | FDD | 1,850-1,910 | 1,930-1,990 |
| B3 | FDD | 1,710-1,785 | 1,805-1,880 |
| B4 | FDD | 1,710-1,755 | 2,110-2,155 |
| B5 | FDD | 824-849 | 869-894 |
| B6 | FDD | 830-840 | 875-885 |
| B7 | FDD | 2,500-2,570 | 2,620-2,690 |
| B8 | FDD | 880-915 | 925-960 |
| B9 | FDD | 1,749.9-1,784.9 | 1,844.9-1,879.9 |
| B10 | FDD | 1,710-1,770 | 2,110-2,170 |
| B11 | FDD | 1,427.9-1,447.9 | 1,475.9-1,495.9 |
| B12 | FDD | 699-716 | 729-746 |
| B13 | FDD | 777-787 | 746-756 |
| B14 | FDD | 788-798 | 758-768 |
| B15 | FDD | 1,900-1,920 | 2,600-2,620 |
| B16 | FDD | 2,010-2,025 | 2,585-2,600 |
| B17 | FDD | 704-716 | 734-746 |
| B18 | FDD | 815-830 | 860-875 |
| B19 | FDD | 830-845 | 875-890 |
| B20 | FDD | 832-862 | 791-821 |
| B21 | FDD | 1,447.9-1,462.9 | 1,495.9-1,510.9 |
| B22 | FDD | 3,410-3,490 | 3,510-3,590 |
| B23 | FDD | 2,000-2,020 | 2,180-2,200 |
| B24 | FDD | 1,626.5-1,660.5 | 1,525-1,559 |
| B25 | FDD | 1,850-1,915 | 1,930-1,995 |
| B26 | FDD | 814-849 | 859-894 |
| B27 | FDD | 807-824 | 852-869 |
| B28 | FDD | 703-748 | 758-803 |
| B29 | FDD | N/A | 716-728 |
| B30 | FDD | 2,305-2,315 | 2,350-2,360 |
| B31 | FDD | 452.5-457.5 | 462.5-467.5 |
| B33 | TDD | 1,900-1,920 | 1,900-1,920 |
| B34 | TDD | 2,010-2,025 | 2,010-2,025 |
| B35 | TDD | 1,850-1,910 | 1,850-1,910 |

TABLE 5-continued

| Band | Mode | Tx Frequency Range (MHz) | Rx Frequency Range (MHz) |
|---|---|---|---|
| B36 | TDD | 1,930-1,990 | 1,930-1,990 |
| B37 | TDD | 1,910-1,930 | 1,910-1,930 |
| B38 | TDD | 2,570-2,620 | 2,570-2,620 |
| B39 | TDD | 1,880-1,920 | 1,880-1,920 |
| B40 | TDD | 2,300-2,400 | 2,300-2,400 |
| B41 | TDD | 2,496-2,690 | 2,496-2,690 |
| B42 | TDD | 3,400-3,600 | 3,400-3,600 |
| B43 | TDD | 3,600-3,800 | 3,600-3,800 |
| B44 | TDD | 703-803 | 703-803 |

For the purpose of description, it will be understood that "quadruplexer," "quadruplexing" and the like can be utilized interchangeably with "quadplexer," "quadplexing" and the like. It will also be understood that "multiplexer," "multiplexing" and the like may or may not include "duplexer," "duplexing" and the like.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While some embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A front-end system comprising:
a filter assembly including a first filter configured to pass a first frequency range associated with a first transmission frequency range of a first band and a second filter configured to pass a second frequency range associated with a first receive frequency range of the first band and with a second receive frequency range of a second band;
a switching circuit in communication with the filter assembly and an antenna port, the switching circuit including a first switch configured to connect the first filter to the antenna port and a second switch configured to connect the second filter to the antenna port, the second switch independently operated from the first switch.

2. The system of claim 1 further comprising a second antenna port, the switching circuit in communication with the filter assembly and the second antenna port.

3. The system of claim 2 wherein the switching circuit includes a third switch configured to connect a third filter of the filter assembly to the second antenna port with the first, second, and third switches being independently operated from each other.

4. The system of claim 1 wherein the first band includes B1 and the second band includes B4.

5. The system of claim 1 wherein the first band includes B1 and the second band includes B10.

6. The system of claim 1 wherein the first band includes B5 and the second band includes B6.

7. The system of claim 1 wherein the first band includes B5 and the second band includes B18.

8. The system of claim 1 wherein the first band includes B14 and the second band includes B28.

9. The system of claim 1 wherein the first band includes B11 and the second band includes B21.

10. The system of claim 1 further comprising a second switching circuit configured to switch frequency bands in a high-band frequency range and the switching circuit is configured to switch frequency bands in a low-band frequency range.

11. The system of claim 10 further comprising a second filter assembly including a third filter configured to pass a third frequency range associated with a third transmission frequency range of a third band and a fourth filter configured to pass a fourth frequency range associated with a third receive frequency range of the third band and with a fourth receive frequency range of a fourth band.

12. The system of claim 11 wherein the second switching circuit is in communication with the second filter assembly and the second antenna port, the second switching circuit including a third switch configured to connect the third filter to the second antenna port and a fourth switch configured to connect the fourth filter to the second antenna port, the fourth switch independently operated from the third switch.

13. The system of claim 1 wherein the filter assembly and the switching circuit are configured to support time-division duplex signals for transmission.

14. The system of claim 1 wherein the filter assembly and the switching circuit are configured to support carrier aggregation for at least one of the combination of bands B1 and B7, B2 and B4, B7 and B3, B5 and B12, B5 and B17, or B8 and B20.

15. A radio-frequency (RF) module comprising:
a packaging substrate configured to receive a plurality of components;
a filter assembly implemented on the packaging substrate and including a first filter configured to pass a first frequency range associated with a first transmission frequency range of a first band and a second filter configured to pass a second frequency range associated with a first receive frequency range of the first band and with a second receive frequency range of a second band; and
a switching circuit implemented on the packaging substrate and in communication with the filter assembly and an antenna port, the switching circuit including a first switch configured to connect the first filter to the antenna port and a second switch configured to connect the second filter to the antenna port, the second switch independently operated from the first switch.

16. The RF module of claim 15 wherein the RF module is a front-end module (FEM).

17. The RF module of claim 16 wherein the FEM further includes a power amplifier module having a plurality of power amplifiers.

18. The RF module of claim 16 wherein the switching circuit is implemented on an antenna switching module (ASM).

19. The RF module of claim 16 wherein the switching circuit is implemented on a semiconductor die.

20. A wireless device comprising:
a transceiver configured to process radio-frequency signals;
a front-end module (FEM) in communication with the transceiver, the FEM including a filter assembly having a first filter configured to pass a first frequency range associated with a first transmission frequency range of a first band and a second filter configured to pass a second frequency range associated with a first receive frequency range of the first band and with a second receive frequency range of a second band, the FEM also including a switching circuit implemented on the packaging substrate and in communication with the filter assembly and an antenna port, the switching circuit including a first switch configured to connect the first filter to the antenna port and a second switch configured to connect the second filter to the antenna port, the second switch independently operated from the first switch; and
an antenna in communication with the signal port, the antenna configured to facilitate either or both of transmission and receiving of RF signals.

* * * * *